United States Patent
Kai et al.

(10) Patent No.: US 7,915,124 B2
(45) Date of Patent: Mar. 29, 2011

(54) METHOD OF FORMING DIELECTRIC LAYER ABOVE FLOATING GATE FOR REDUCING LEAKAGE CURRENT

(75) Inventors: James K. Kai, Santa Clara, CA (US);
Dana Lee, Saratoga, CA (US); Takashi Whitney Orimoto, Sunnyvale, CA (US);
Vinod R. Purayath, Santa Clara, CA (US); George Matamis, San Jose, CA (US); Henry Chin, Palo Alto, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 12/170,321

(22) Filed: Jul. 9, 2008

(65) Prior Publication Data

US 2010/0009503 A1 Jan. 14, 2010

(51) Int. Cl.
*H01L 21/8247* (2006.01)
(52) U.S. Cl. .............................. 438/261; 257/E21.179
(58) Field of Classification Search .......... 438/257–267; 257/E21.179
See application file for complete search history.

(56) References Cited

U.S. PATENT DOCUMENTS

| | | | |
|---|---|---|---|
| 5,104,819 A | | 4/1992 | Freiberger et al. |
| 5,229,312 A | | 7/1993 | Mukherjee et al. |
| 5,923,976 A | | 7/1999 | Kim |
| 6,008,091 A | | 12/1999 | Gregor et al. |
| 6,069,041 A | * | 5/2000 | Tanigami et al. ............. 438/261 |
| 6,093,607 A | * | 7/2000 | Hsieh et al. ................... 438/266 |
| 6,127,227 A | * | 10/2000 | Lin et al. ....................... 438/261 |
| 6,362,045 B1 | | 3/2002 | Lin et al. |
| 6,753,224 B1 | | 6/2004 | Lin et al. |
| 6,855,994 B1 | | 2/2005 | King et al. |
| 7,015,534 B2 | | 3/2006 | Colombo |
| 7,026,684 B2 | | 4/2006 | Sakuma et al. |
| 7,202,125 B2 | | 4/2007 | Pham et al. |
| 7,224,019 B2 | | 5/2007 | Hieda et al. |
| 7,253,470 B1 | | 8/2007 | Liu et al. |
| 7,279,735 B1 | | 10/2007 | Yu et al. |
| 7,332,408 B2 | * | 2/2008 | Violette ........................ 438/435 |
| 2006/0231884 A1 | | 10/2006 | Yonemochi et al. |
| 2007/0210338 A1 | | 9/2007 | Orlowski |
| 2007/0257305 A1 | | 11/2007 | Sasago et al. |
| 2007/0298568 A1 | | 12/2007 | Mokhlesi |
| 2008/0061353 A1 | | 3/2008 | Oh |

(Continued)

OTHER PUBLICATIONS

International Search Report and Written Opinion dated Sep. 14, 2009 in PCT Application No. PCT/US2009/049620.

(Continued)

*Primary Examiner* — Richard A. Booth
(74) *Attorney, Agent, or Firm* — Vierra Magen Marcus & DeNiro LLP

(57) ABSTRACT

A method of fabricating a memory system is disclosed that includes a set of non-volatile storage elements. The method includes forming a floating gate having a top and at least two sides. A dielectric cap is formed at the top of the floating gate. An inter-gate dielectric layer is formed around the at least two sides of the floating gate and over the top of the dielectric cap. A control gate is formed over the top of the floating gate, the inter-gate dielectric layer separates the control gate from the floating gate. In one aspect, forming the dielectric cap includes implanting oxygen in the top of the floating gate and heating the floating gate to form the dielectric cap from the implanted oxygen and silicon from which the floating gate was formed.

20 Claims, 22 Drawing Sheets

U.S. PATENT DOCUMENTS

| | | |
|---|---|---|
| 2008/0149987 A1 | 6/2008 | Alapati et al. |
| 2008/0171406 A1 | 7/2008 | Orimoto et al. |
| 2008/0185634 A1 | 8/2008 | Li et al. |
| 2008/0191262 A1 | 8/2008 | Chang et al. |
| 2009/0140315 A1* | 6/2009 | Kuniya .................. 257/316 |
| 2009/0225602 A1 | 9/2009 | Sandhu et al. |

OTHER PUBLICATIONS

Notice of Allowance and Fee(s) Due dated Oct. 6, 2009 in U.S. Appl. No. 12/170,327.
Office Action dated Nov. 17, 2009 in U.S. Appl. No. 12/242,857.
Office Action dated Jan. 12, 2010, U.S. Appl. No. 12/170,327, filed Jul. 9, 2008.
Response to Office Action dated Feb. 12, 2010, U.S. Appl. No. 12/242,857, filed Sep. 30, 2008.
Office Action dated Apr. 14, 2010, U.S. Appl. No. 12/242,857, filed Sep. 30, 2008.
Response to Office Action dated Jun. 14, 2010, U.S. Appl. No. 12/242,857, filed Sep. 30, 2008.
Response to Office Action dated Jul. 12, 2010, U.S. Appl. No. 12/170,327, filed Jul. 9, 2008.
Final Office Action dated Sep. 29, 2010, U.S. Appl. No. 12/170,327, filed Jul. 9, 2008.
Notice of Allowance dated Jan. 18, 2011, U.S. Appl. No. 12/170,327, filed Jul. 9, 2008.
Amendment dated Dec. 29, 2010, U.S. Appl. No. 12/170,327, filed Jul. 9, 2008.
International Preliminary Report and Written Opinion dated Jan. 11, 2011 in PCT Application No. PCT/US2009/049620.

* cited by examiner

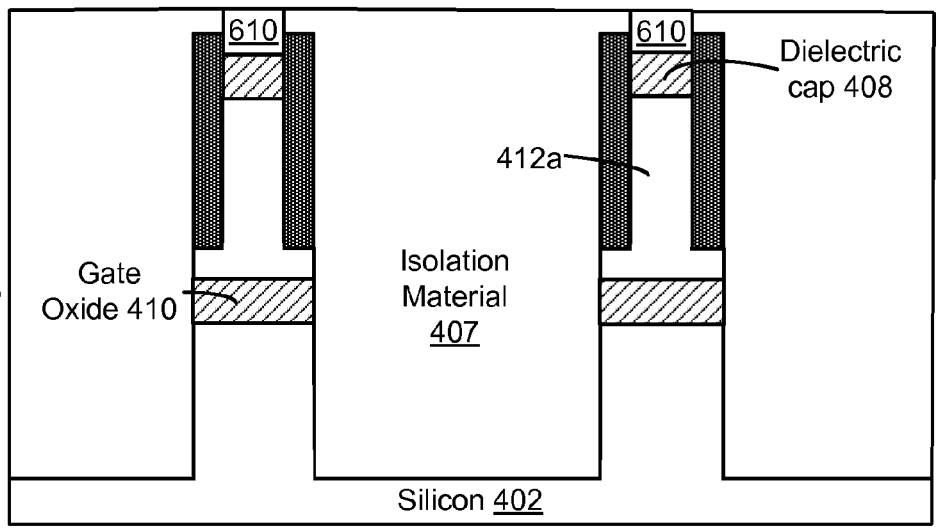
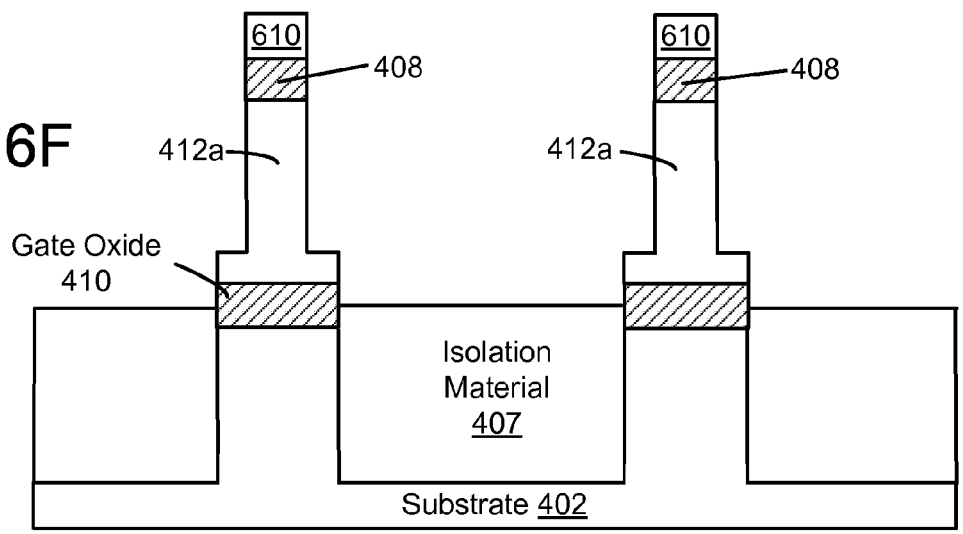
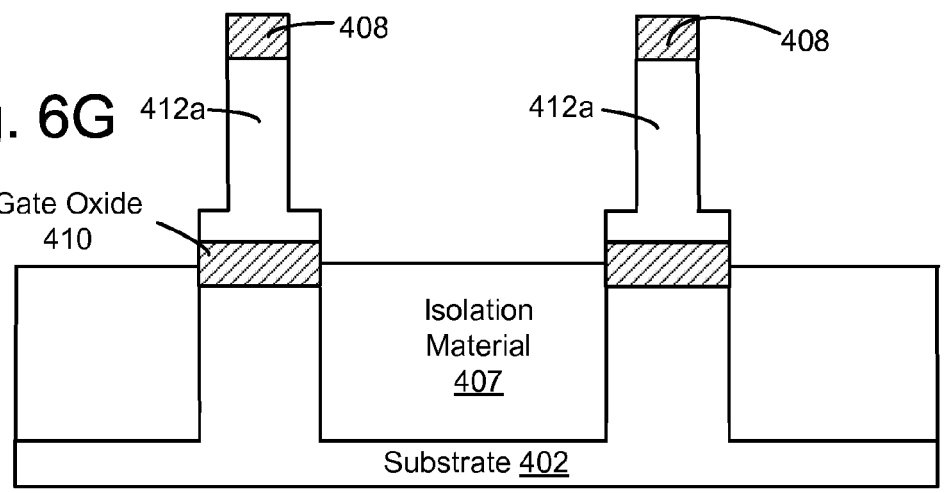

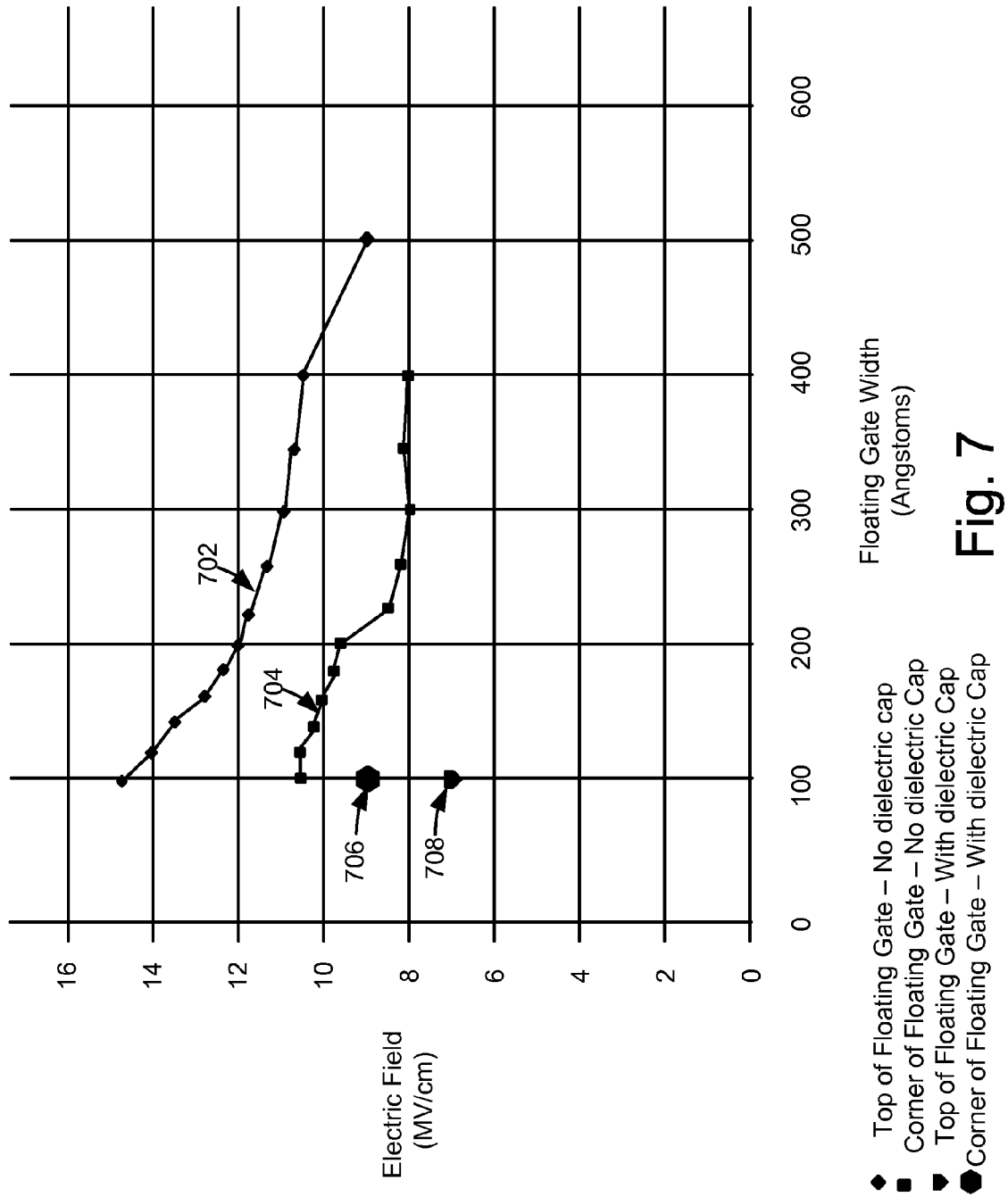

METHOD OF FORMING DIELECTRIC LAYER ABOVE FLOATING GATE FOR REDUCING LEAKAGE CURRENT

CROSS-REFERENCE TO RELATED APPLICATION

The following application is cross-referenced and incorporated by reference herein in its entirety:

U.S. patent application Ser. No. 12/170,327, entitled "DIELECTRIC LAYER ABOVE FLOATING GATE FOR REDUCING LEAKAGE CURRENT," by Dana Lee, et al., filed on even date herewith.

BACKGROUND OF THE INVENTION

1. Field of the Invention

The present invention relates to non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Typical EEPROMs and flash memories utilize a memory cell with a floating gate that is provided above a channel region in a semiconductor substrate. The floating gate is separated from the channel region by a dielectric region. For example, the channel region is positioned in a p-well between source and drain regions. A control gate is separated from the floating gate by another dielectric region (inter-gate or inter poly dielectric). The threshold voltage of the memory cell is controlled by the amount of charge that is retained on the floating gate. That is, the level of charge on the floating gate determines the minimum amount of voltage that must be applied to the control gate before the memory cell is turned on to permit conduction between its source and drain.

Some EEPROM and flash memory devices have a floating gate that is used to store two ranges of charges and, therefore, the memory cell can be programmed/erased between two states (e.g. a binary memory cell). A multi-bit or multi-state flash memory cell is implemented by identifying multiple, distinct threshold voltage ranges within a device. Each distinct threshold voltage range corresponds to predetermined values for the set of data bits. To achieve proper data storage for a multi-state cell, the multiple ranges of threshold voltage levels should be separated from each other by sufficient margin so that the level of the memory cell can be read, programmed or erased in an unambiguous manner.

When programming typical flash memory devices, a program voltage is applied to the control gate and the bit line is grounded. Due to capacitive coupling between the control gate and floating gate, the program voltage on the control gate is coupled to the floating gate causing a floating gate voltage. The floating gate voltage causes electrons from the channel to be injected into the floating gate. When electrons accumulate in the floating gate, the floating gate becomes negatively charged and the threshold voltage of the memory cell as seen from the control gate is raised. In order to preserve the programmed state of the memory cell, the charge on the floating gate needs to be maintained over time. However, it is possible for charge to leak through the inter-poly dielectric from the floating gate to the control gate, which is referred to as leakage current.

In recent flash memory technologies, short program/erase times and low operating voltages are the main obstacles to overcome in order to realize high speed and density, and low power operation. Thus, it has become increasingly necessary to increase the capacitive coupling between the floating gate and the control gate of the memory cell, while simultaneously inhibiting electrons from escaping from the floating gate to the control gate. The control gate-to-floating gate capacitance, which affects the coupling ratio, depends upon the thickness of the inter-poly dielectric (IPD) between the two gates and the relative permittivity or dielectric constant, K, of the IPD. One technique to achieve a high coupling ratio is to use a thin IPD. However, if the IPD is too thin, the leakage current can become undesirably large.

As non-volatile memory structures become smaller, leakage current is becoming a more difficult problem. One reason for the leakage current problem is the strength of the electric field that occurs in various portions of the IPD when a voltage is applied to the control gate. In particular, the electric field is enhanced in certain regions of the IPD, which results in greater leakage current. Referring to FIG. 1A, the electric field is the strongest in the IPD 106 near sharp corners of the floating gate 102 and control gate 104. In the region near the corner of the IPD 106 that is circled, the magnitude of the electric field is proportional to $1/A$, where A is the radius of curvature of the corner of the floating gate 102. Note that a sharp corner corresponds to a very small radius of curvature, and hence a strong electric field.

In order to reduce the strength of the electric field in the IPD 106 at the corner of the floating gate 102, the radius of curvature of the top of the floating gate 102 can be increased, as depicted in FIG. 1B. Note this also changes the curvature of the control gate 104. By reducing the strength of the electric field, the leakage current is reduced. However, in order to continue to scale down the size of device structures, it is desirable to narrow the width of the floating gate 102, as depicted in FIG. 1C. Note that the rounding of the polysilicon floating gate 102 extends completely across the top of the floating gate 102 of FIG. 1C. The amount of rounding of the floating gate 102 that is possible is limited by the width of the floating gate 102. That is, the largest possible radius of curvature (A) is limited to half the width of the floating gate 102. Note that if the width (2A) of the floating gate 102 is further reduced, the maximum possible radius of curvature is also further reduced. Therefore, as feature sizes of memory cells continue to be reduced, the electric field in the IPD 106 and hence leakage current becomes more difficult to deal with.

One technique to reduce the electric field is to form the IPD 106 with a thin film having a high dielectric constant. However, such films are difficult to work with and hence undesirable. For example, paraelectric materials have dielectric constants that are usually at least two orders of magnitude above that of silicon dioxide, but several problems limit their use as gate dielectrics. One such problem is oxygen diffusion. During high temperature processes associated with semiconductor fabrication, oxygen diffuses from the IPD 106 to the interface between the IPD 106 and the floating gate 102 and control gate 104 that sandwich the IPD 106, thus forming an undesirable oxide layer that decreases the overall capacitance of the dielectric system. Therefore, the effect of the high dielectric constant paraelectric material is reduced.

Metal oxides have also been proposed as high K materials for flash memory devices. Metal oxides, in particular aluminum oxide ($Al_2O_3$), have a low leakage current. Moreover, metal oxides have high temperature endurance for process integration. However, because the deposited high dielectric metal oxides have non-stoichiometric composition, they are prone to large electrical defects or traps in the bulk of the dielectric and at the dielectric/semiconductor interface. These defects or traps enhance conduction through the dielectric and reduce the breakdown strength of the dielectric.

Another technique to reduce the electric field in the IPD is to increase the thickness of the IPD 106. However, increasing the thickness of the IPD 106 tends to reduce the capacitive coupling between the floating gate 102 and the control gate 106, which is undesirable for reasons previously discussed. In general, increasing the IPD 106 thickness tends to fail when the radius of curvature is less than the thickness of the IPD 106 or when the thickness of the IPD 106 approaches the dimension ("feature size") of the memory cell.

SUMMARY OF THE INVENTION

Embodiments in accordance with the disclosure, roughly described, pertain to a non-volatile memory cell and techniques for fabricating the memory cell. The memory cell has a dielectric cap above the floating gate. In one embodiment, the dielectric cap resides between the floating gate and a conformal IPD layer. The dielectric cap reduces the leakage current between the floating gate and a control gate. The dielectric cap achieves this reduction by reducing the strength of the electric field at the top of the floating gate, which is where the electric field would be strongest without the dielectric cap for a floating gate having a narrow stem.

Another embodiment is a method for fabricating a non-volatile storage element. The method includes forming a floating gate having a top and at least two sides. A dielectric cap is formed at the top of the floating gate. An inter-gate dielectric layer is formed around the at least two sides of the floating gate and over the top of the dielectric cap. A control gate is formed over the top of the floating gate, the inter-gate dielectric layer separates the control gate from the floating gate.

In one aspect, forming the dielectric cap includes implanting oxygen in the top of the floating gate and heating the floating gate to form the dielectric cap from the implanted oxygen and silicon from which the floating gate was formed.

These and other objects and advantages will appear more clearly from the following description in which various embodiments have been set forth in conjunction with the drawings.

BRIEF DESCRIPTION OF THE DRAWINGS

FIGS. 6A-6J depict a portion of a non-volatile memory cell array at various stages of the process described in FIG. 5.

FIG. 7 is a graph illustrating electric fields for various configurations of non-volatile storage elements.

DETAILED DESCRIPTION

Figure 2:
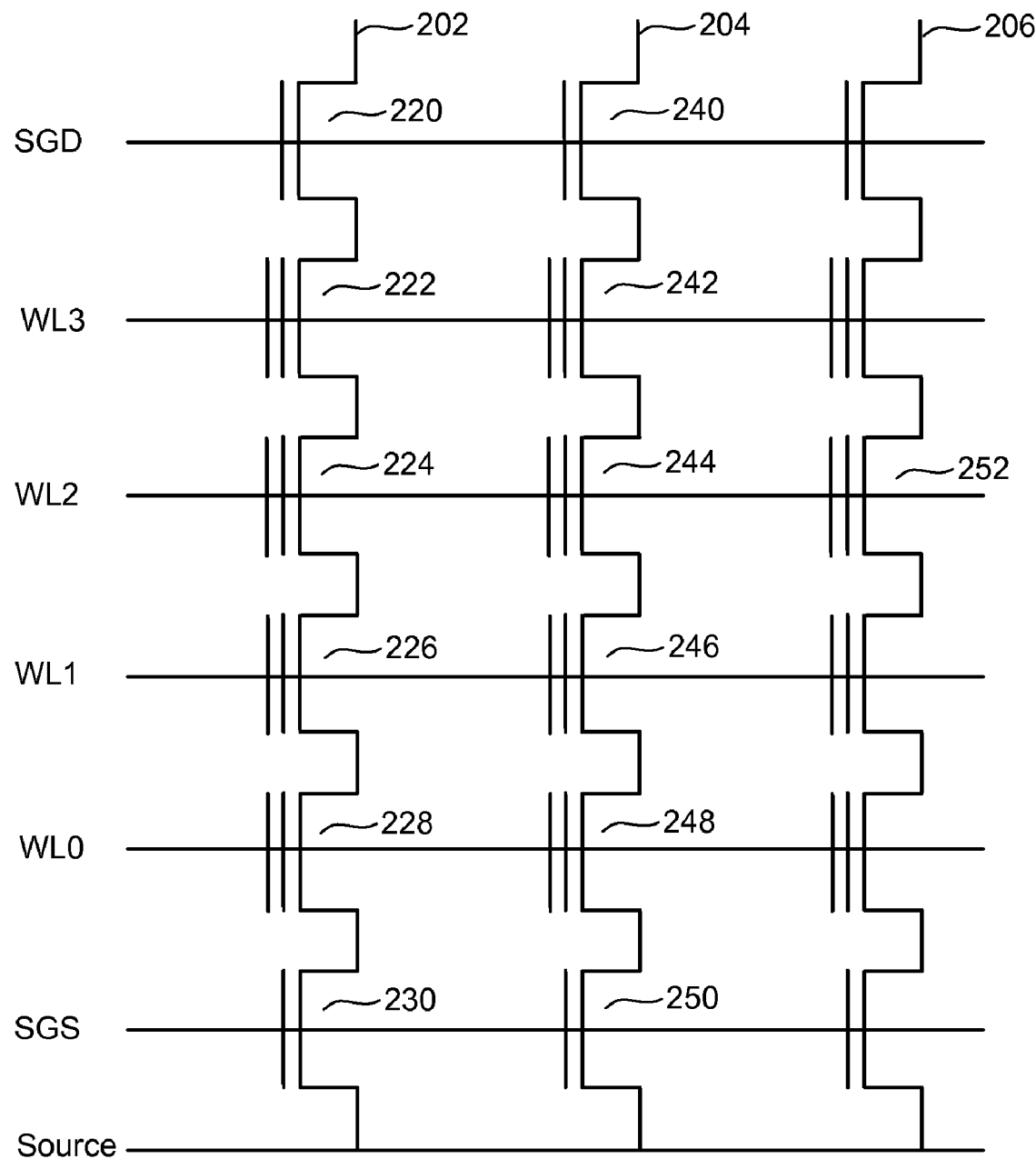
FIG. 2 is a circuit diagram depicting three NAND strings.

One example of a flash memory system uses the NAND structure, which includes arranging multiple floating gate transistors in series between two select gates. The transistors in series and the select gates are referred to as a NAND string. A typical architecture for a flash memory system using a NAND structure will include several NAND strings. For example, FIG. 2 shows three NAND strings 202, 204 and 206 of a memory array having many more NAND strings. Each of the NAND strings of FIG. 2 includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array.

Figure 3:
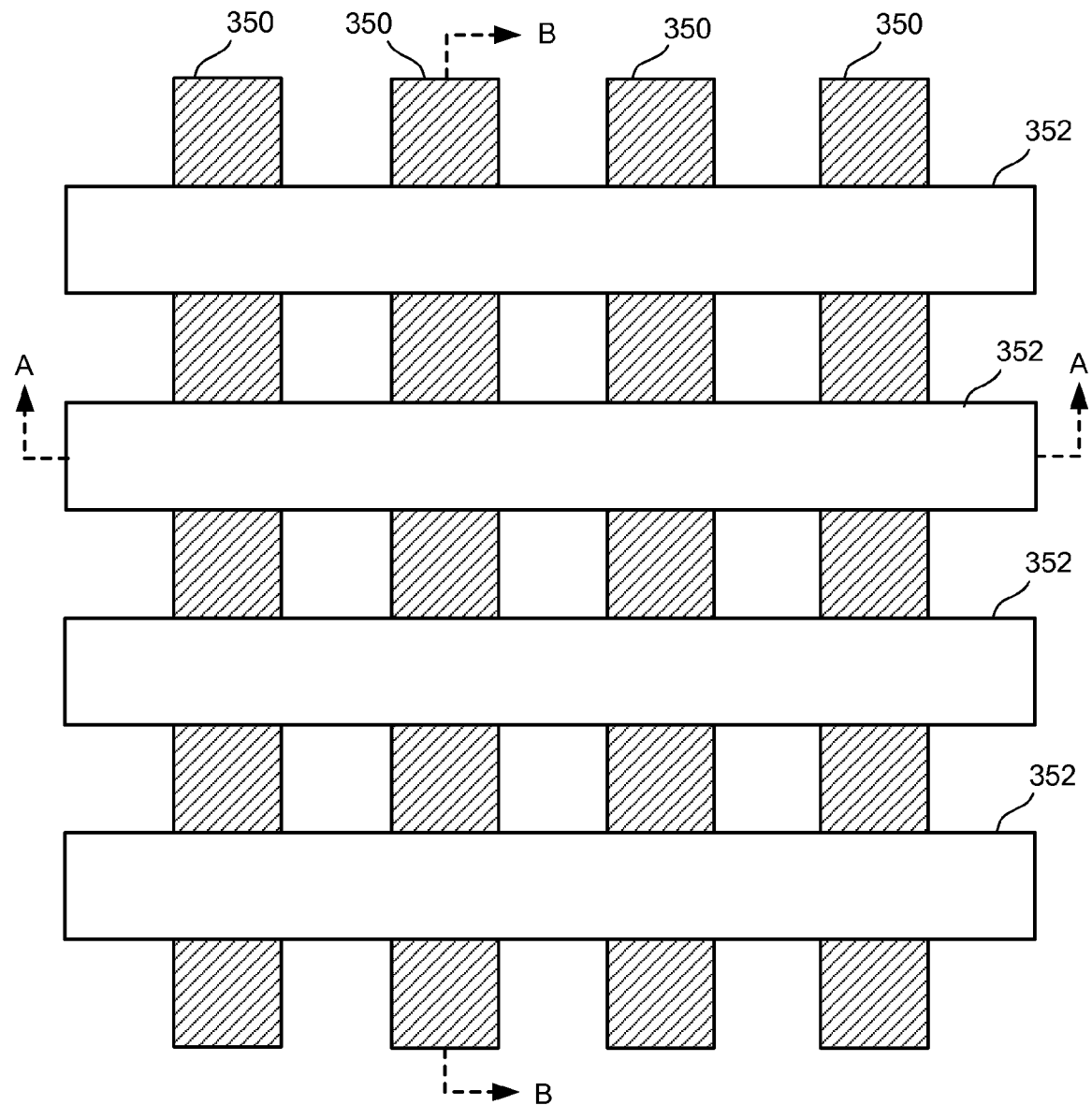
FIG. 3 depicts the structure of a non-volatile memory device.

FIG. 3 is a top view of a portion of an array of NAND flash memory cells. The array includes bit lines 350 and word lines 352. Note that FIG. 3 does not show all of the other details of the flash memory cells.

Note that a NAND string can have fewer or more memory cells than depicted in FIGS. 2 and 3. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2 and 3. For example, a wordline can include thousand or tens of thousands of memory cells. The discussion herein is not limited to any particular number of memory cells in a wordline.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456,528; and U.S. Pat. Publication No. US2003/0002348. The discussion herein can also apply to other types of flash memory in addition to NAND as well as other types of non-volatile memory. For example, the following patents describe NOR type flash memories and are incorporated herein by reference in their entirety: U.S. Pat. Nos. 5,095,344; 5,172,338; 5,890,192 and 6,151,248.

Figure 4A:
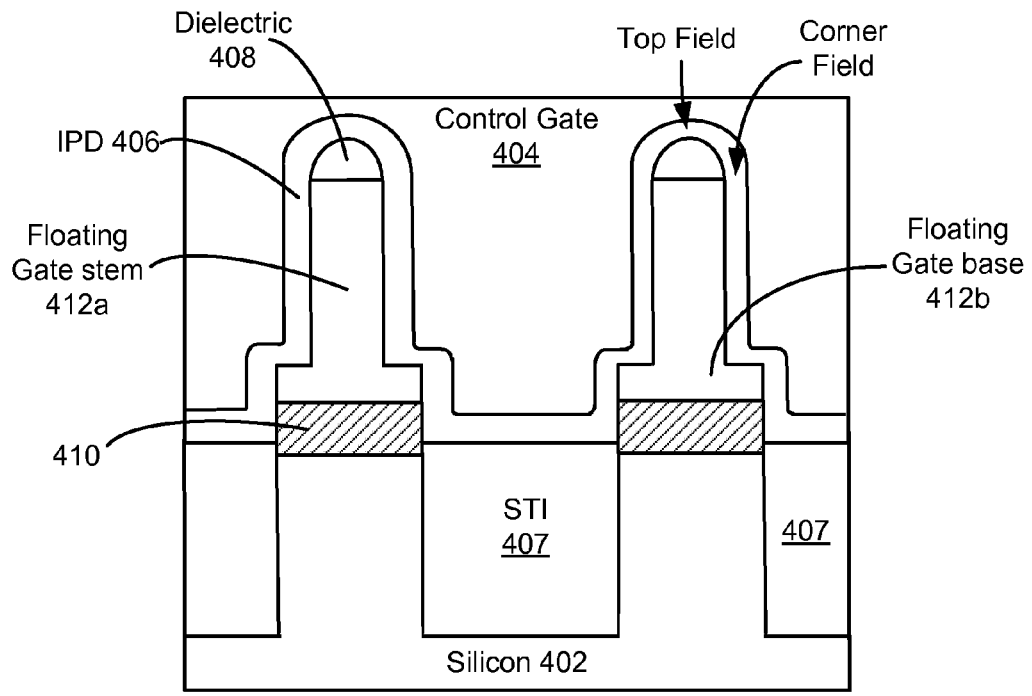
FIGS. 4A and 4B are plan views of a portion of a memory cell array.
Figure 4B:
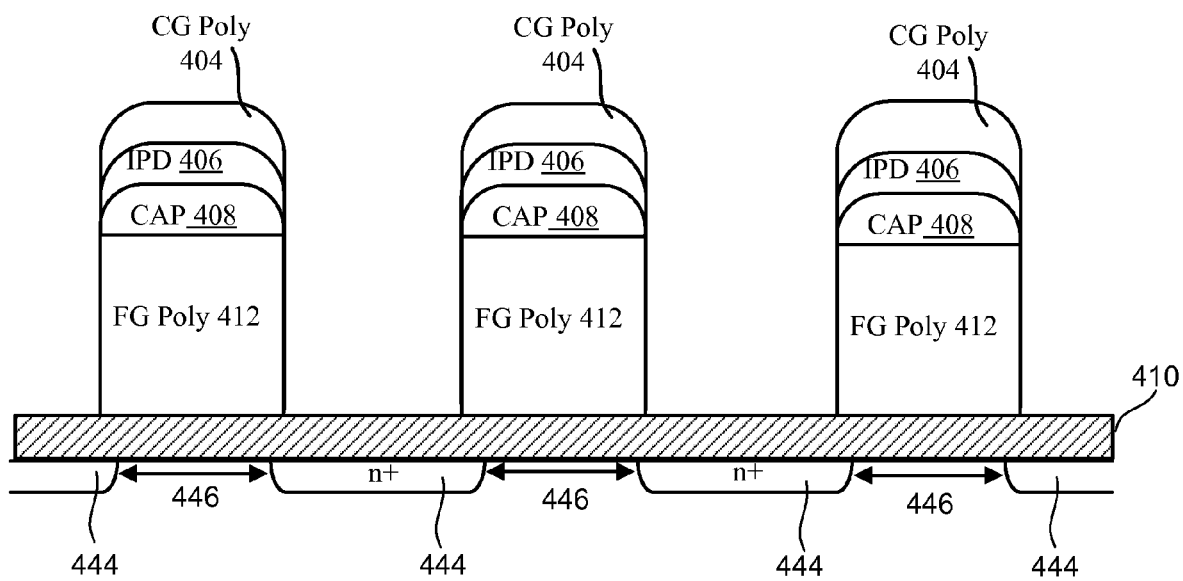

FIG. 4A and FIG. 4B are two-dimensional block diagrams of one embodiment of a portion of an array of non-volatile storage elements. FIG. 4A depicts a cross section of the memory array along cut A-A of FIG. 3 (cross section along word line). FIG. 4B depicts a cross section of the memory array along cut B-B of FIG. 3 (cross section along bit line). The memory cell of FIGS. 4A and 4B includes a triple well (not depicted in the figures) comprising a P substrate, an N-well and a P-well. Within the P-well are N+ diffusion regions 444, which serve as source/drains. Whether N+ diffusion regions 444 are labeled as source regions or drain regions is somewhat arbitrary; therefore, the source/drain regions 444 can be thought of as source regions, drain regions, or both. In a NAND string, a source/drain region 444 acts as a source for one memory cell while serving as a drain for an adjacent memory cell.

Between source/drain regions 444 is the channel 446. Above channel 446 is a first dielectric area 410, otherwise referred to as a gate oxide. In one embodiment, dielectric layer 410 is made of $SiO_2$. Other dielectric materials can also be used. Above dielectric layer 410 is floating gate 412. The floating gate, under low voltage operating conditions associated with read or bypass operations, is electrically insulated/isolated from channel 446 by dielectric layer 410. Floating gate 412 is typically made from poly-silicon that is doped with n-type dopants; however, other conducting materials, such as metals, can also be used. Above floating gate 412 is a dielectric cap 408. Above the top and around the sides of the floating gate 412 is a second dielectric layer 406, which is also referred to as an IPD 406. Above the IPD 406 is the polysilicon control gate 404. The control gate 404 can include additional layers of Tungsten Silicide (WSi) layer and Silicon Nitride (SiN) layer. A WSi layer is a lower resistance layer, whereas a SiN layer act as an insulator.

Dielectric layer 410, floating gate 412, dielectric cap 408, IPD 406, and control gate 404 comprise a floating gate stack. An array of memory cells will have many such floating gate stacks. In other embodiments, a floating gate stack may have more or fewer components than depicted in FIGS. 4A and 4B; however, a floating gate stack is so named because it includes a floating gate as well as other components.

Referring to FIG. 4A, shallow trench isolation (STI) structures 407 provide electrical insulation between strings of memory cells. In particular, an STI 407 separates the source/drain regions (not depicted in FIG. 4A) of one NAND string from the next. In one embodiment, the STI 407 are filled with $SiO_2$.

In FIGS. 4A and 4B, the floating gate has an "inverted T" shape. That is, the floating gate has a base 412b and a stem 412a. The inverted T shape helps to increase the area of the portions of the floating gate 412 that coincides with the control gate 404 while allowing for the floating gates 412 to be spaced closely together. In this example, a cross section of the floating gates taken along the word line have an inverted T shape. In another embodiment, the inverted T-shape occurs along a cross section taken along the bit line. For example, the floating gates in FIG. 4B would have an inverted T shape. However, the floating gates are not required to have an inverted T shape. In general, any floating gate with a top and sides that are separated by an IPD from a control gate may benefit from a dielectric cap over the top of the floating gate. However, floating gates having a relatively thin width in at least one direction may be more susceptible to problems of high electric fields in the IPD, and hence may receive a greater benefit from a dielectric cap.

It is not required that the stem 412a of the floating gate 412 have a relatively uniform width as depicted in FIG. 4A. In an alternative embodiment, the stem 412a of the floating gate is more narrow near the dielectric cap 408 than at the bottom near the base 412b of the floating gate.

Techniques are disclosed herein for reducing the strength of the electric field in certain regions of the IPD 406. One of the floating gates 412 has an arrow labeled "top field," which refers to the electrical field in the IPD 406 above the top of the floating gate 412. The arrow labeled "corner field" refers to the electrical field in the IPD 406 near the top corner of the floating gate 412. In some embodiments, the strength of the electrical field at the top of the floating gate 412 is reduced by the dielectric cap 408 such that it is less than (or at least no more than) the strength of the electrical field at the corner of the floating gate 412. However, it is not a requirement that the electrical field at the top of the floating gate 412 be weaker than the electrical field at the corner of the floating gate 412. For example, the dielectric cap 408 may serve to weaken the electrical field at the top of the floating gate 412 somewhat, but does not have to weaken the electrical field such that it is weaker than the electrical field at the corner of the floating gate 412. Reducing the strength of the electric field at the top of the floating gate can reduce overall leakage current without significantly impacting overall performance.

Figure 5:
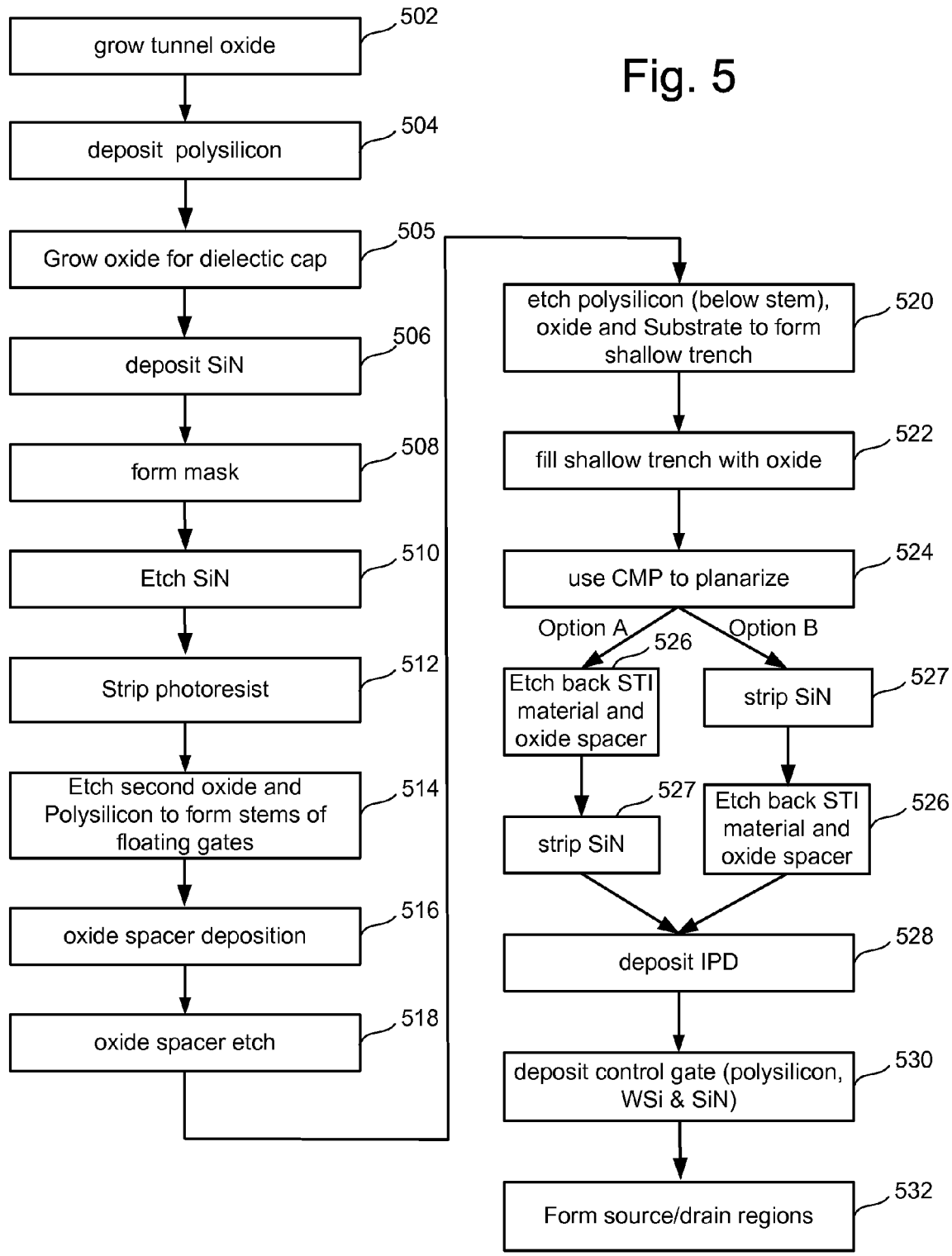
FIG. 5 is a flow chart describing one embodiment of a process for making a non-volatile memory cell array.

FIG. 5 is a flow chart describing one embodiment of a portion of the process for manufacturing the memory cells of FIGS. 4A and 4B. FIGS. 6A-6J depict the memory cells at various stages of the process. The process of FIG. 5 is described with respect to references numerals from FIGS. 4A and 4B and FIGS. 6A-6J. FIGS. 6A-6J depict a cross section along line A-A in FIG. 3. In this example, the floating gates are relatively narrow when viewed in a cross section taken along the word line. However, note that the principles discussed herein apply to floating gates that are narrow when viewed in a cross section taken along the bit line or both the word line and the bit line.

This flow chart does not describe all implant steps, the gap fill of etched volumes between the floating gate stacks, or forming the contacts, metallizations, vias, and passivation, as well as other portions of the manufacturing process known in the art. There are many ways to manufacture memory according to the present invention and, thus, the inventors contemplate that various methods other than that described by FIG. 5 can be used. While a flash memory chip will include core memory and peripheral circuitry, the process steps of FIG. 5 are intended only to describe in general terms one possible process recipe for the fabrication of the core memory array.

Figure 6A:
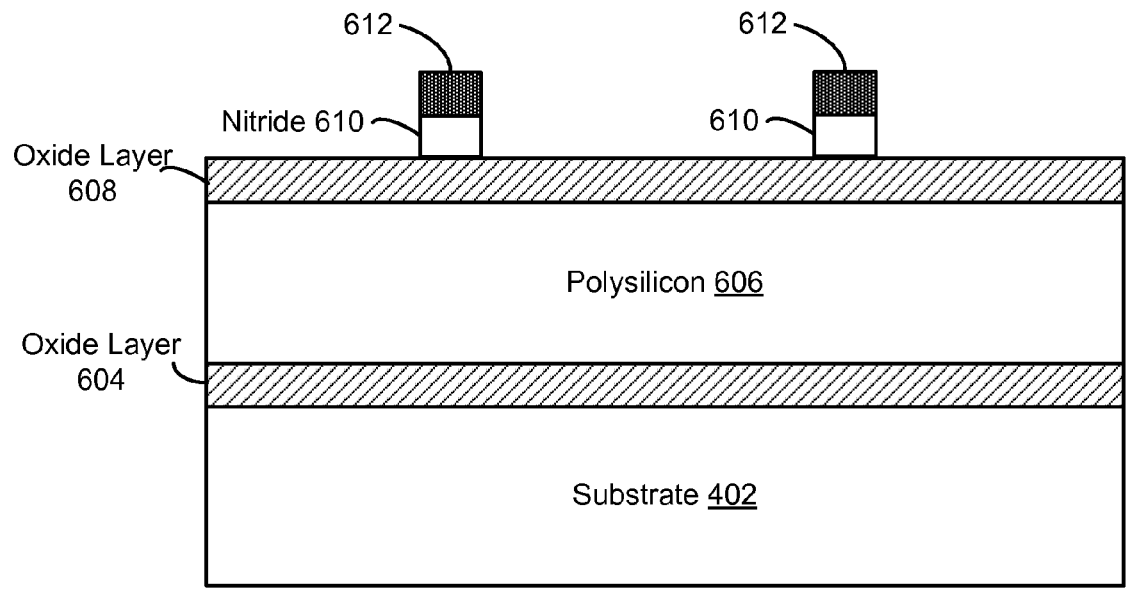

Step 502 of FIG. 5 includes growing tunnel oxide layer 604 on top of a silicon substrate 602. The tunnel oxide layer 604 will be used to form gate dielectric layer 410. In step 504, a polysilicon layer 606 that is used to form the floating gate 412 is deposited over the oxide layer 604 using CVD, PVD, ALD or another suitable method. In step 505, a second oxide layer 608 is grown on top of the polysilicon 606. This second oxide layer 608 will be used to form the dielectric cap 408. In step 506, a SiN layer is deposited over the second oxide layer 608. The SiN can be deposited by, for example, CVD. In step 508, a photoresist is added. For example an amorphous silicon pattern 612 is defined using a spacer process. The silicon pattern 612 is transferred to the nitride hard mask 610, in step 508. Step 510 includes etching the nitride hard mask 610 using anisotropic plasma etching, (i.e. reactive ion etching). The results of step 502-510 are depicted in FIG. 6A, which shows the silicon substrate 402, the first oxide layer 604, polysilicon layer 606, second oxide layer 608, the nitride hard mask 610 that remain after etching, and the amorphous silicon pattern 612.

Figure 6B:
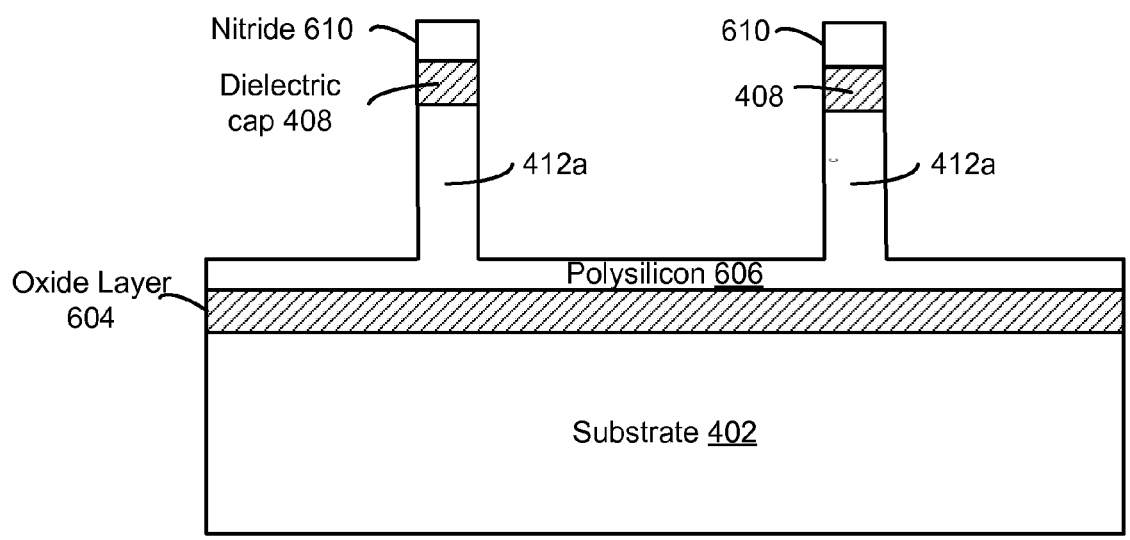

After the hard mask layer 610 is etched, the photoresist 612 is stripped away in step 512 and the hard mask layer 610 can be used as the mask for etching the underlying layers. Step 514 includes etching through the second oxide layer 608 and a portion of the polysilicon 606 to form the stems 412a of the floating gates 412. The etching can be performed using anisotropic plasma etching with the proper balance between physical and chemical etching for each planar layer encountered. The portions of the second oxide layer 608 that remain after etching will form the dielectric caps 408. Techniques for stopping the etch of the polysilicon 606 at the appropriate depth are known in the art. Example techniques for stopping the etching of polysilicon can be found in U.S. patent application Ser. No. 11/960,485, entitled "Enhanced Endpoint Detection in Non-Volatile Memory Array Fabrication," filed on Dec. 19, 2007; and U.S. patent application Ser. No. 11/960,498, entitled "Composite Charge Storage Structure Formation In Non-Volatile Memory Using Etch Stop Technologies," filed on Dec. 19, 2007, both of which are incorporated herein by reference. The result of steps 512-514 is depicted in FIG. 6B, which shows the formation of the floating gate stem 412a with the dielectric cap 408 above.

Figure 6C:
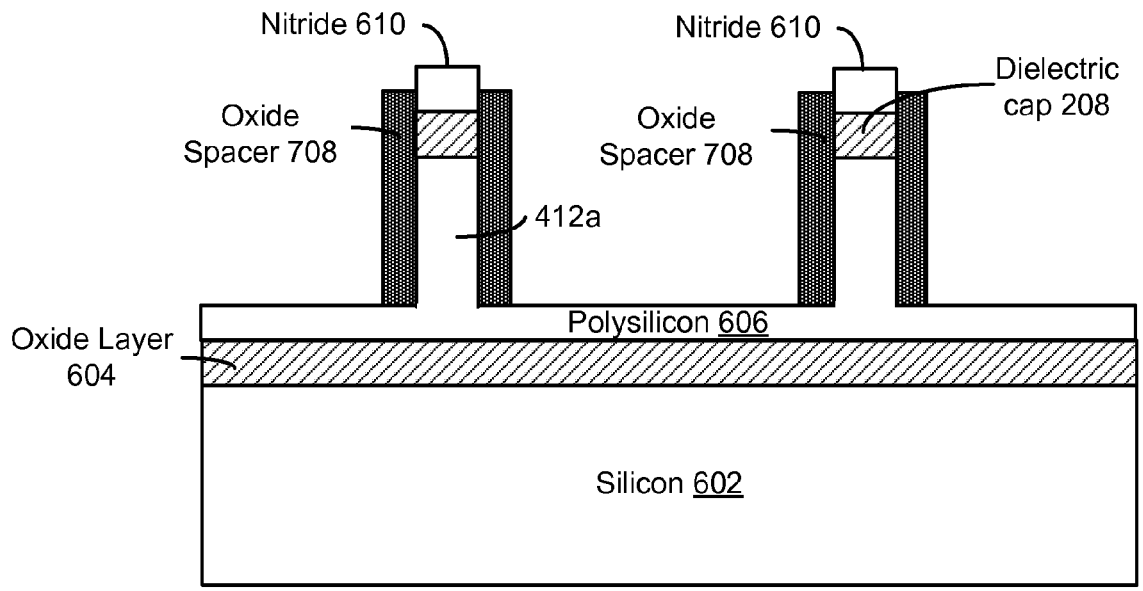

In step 516, an oxide-based spacer 708 such as tetraethyl orthosilicate (TEOS) is grown. In one embodiment, an isotropic deposition process is used. In step 518, the oxide spacer 708 is etched so that it is removed from the horizontal surfaces but not the vertical surfaces. In one embodiment, an anisotropic etching process is used to form sidewall oxide spacers 708. The result is depicted in FIG. 6C in which the oxide spacer 708 is depicted along the sides of the stem 412a of the floating gate 412 and the dielectric cap 408.

Figure 6D:
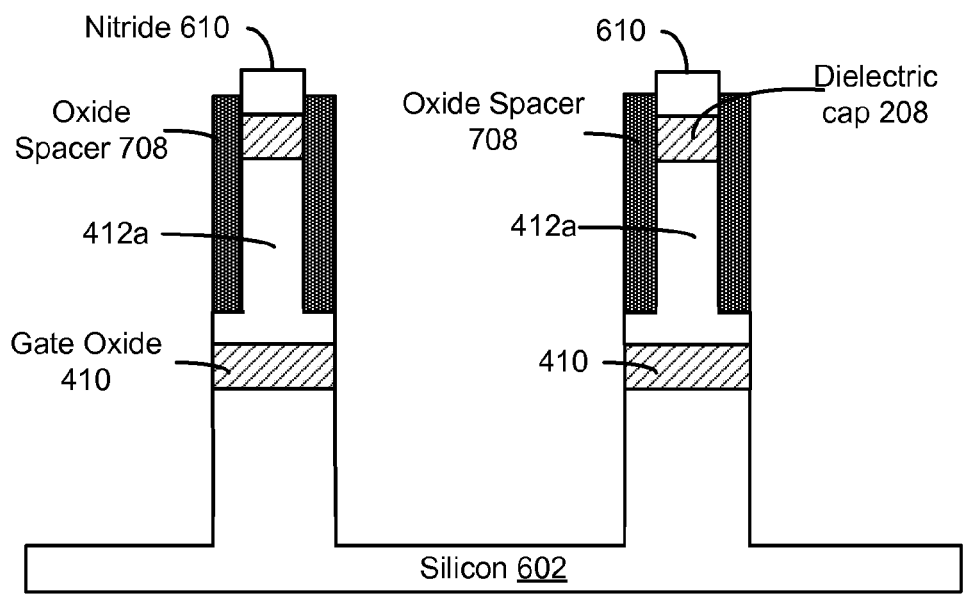
Figure 6H:
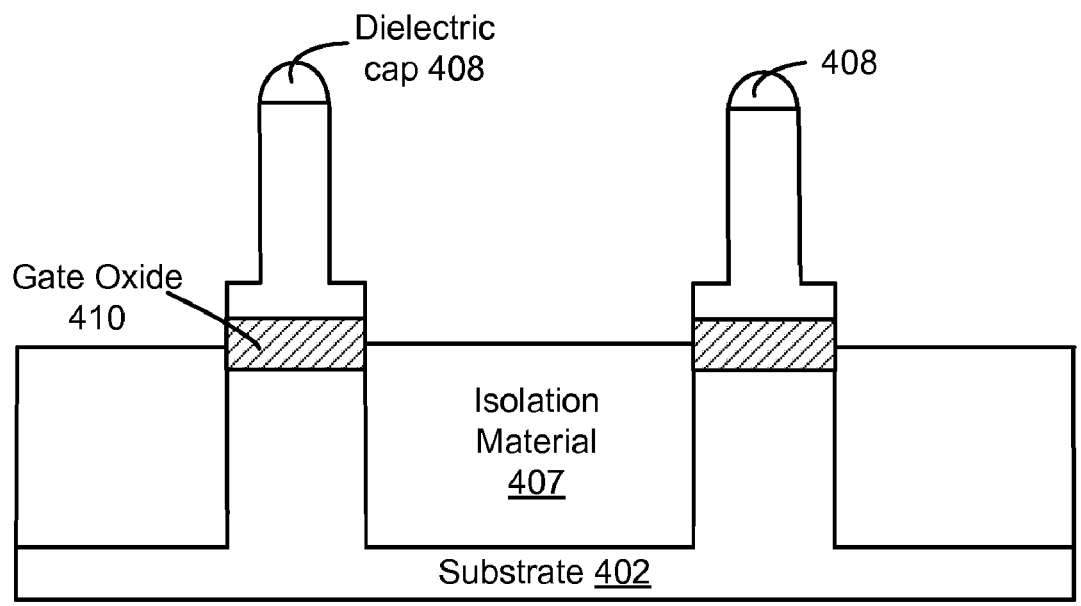
Figure 6I:
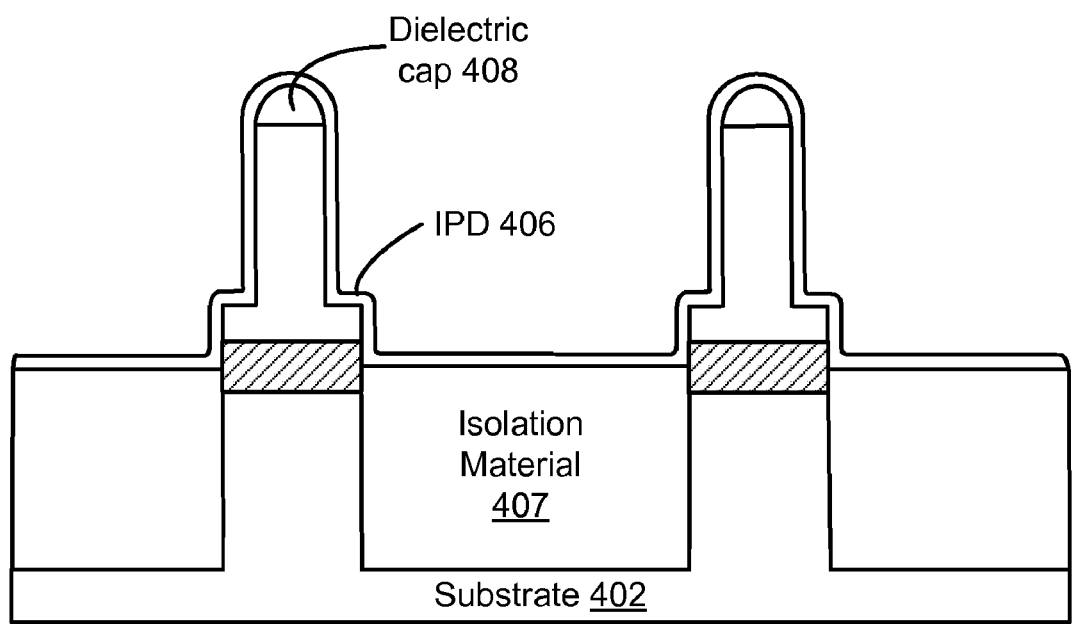
Figure 6J:
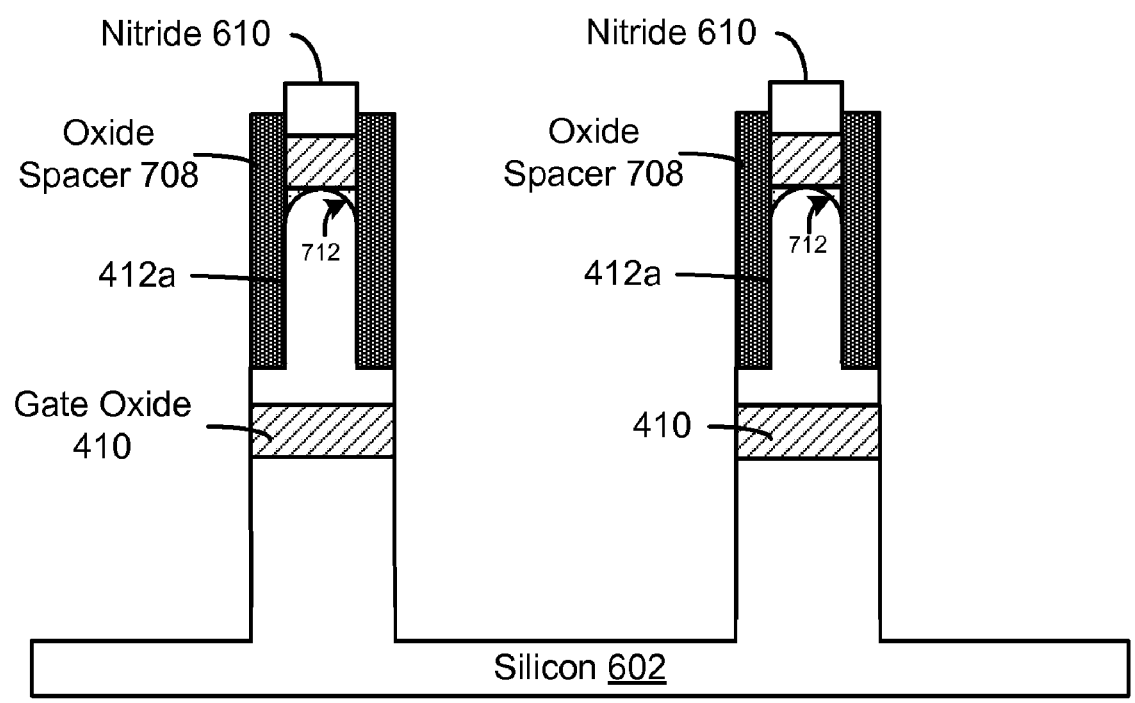

During or after steps 516-518, the tip of the floating gate stem 412a can be oxidized to form a "bird's beak" on top of the floating gate poly. Oxidizing the floating gate polysilicon serves to round off the corners at the top of the floating gate stem 412a. Changing the time and chemistry of the oxidation can curve the top of the floating gate stem 412a to a greater or lesser degree. FIG. 6J depicts floating gates having their tops rounded by the "bird's beak" 712 at the top of the floating gate 412. Because the bird's beak 712 comprises silicon dioxide it may tend to act as a dielectric. Thus, in one implementation, the bird's beak 712 can be considered part of the dielectric cap. Note that the bird's beak 712 can have an impact on the floating gate's overall height and stem width. Therefore, such effects should be pre-compensated for earlier in the process flow.

Next, with the oxide spacer 708 in place, shallow trench isolation trenches are formed. In step 520, with the oxide spacer 708 in place, the lower portion of polysilicon 606, the first oxide layer 604, and the top of the silicon substrate 602 are etched. The result is depicted in FIG. 6D. In one embodiment, the etch is approximately 0.2 microns into the substrate 602 to create shallow trench isolation (STI) areas between the NAND strings, where the bottom of the trenches are inside the top of the P-well.

In step 522, the STI trenches are filled with isolation material 407 such as partially stabilized zirconia (PSZ), $SiO_2$ (or another suitable material) up to the top of the hard mask 610 using CVD, rapid ALD or another method. In step 524, chemical mechanical polishing (CMP), or another suitable process, is used to polish the isolation material 407 flat until reaching the SiN 610. The result of steps 522-524 is depicted in FIG. 6E.

Step 526 is etching back the STI isolation material 407 and the oxide spacer 708. Step 527 is removing the nitride hard mask 610. These steps can be performed in either order, as depicted by option A and option B in the process flow. Option A will be discussed first. In step 526, the STI isolation material 407 and oxide spacer 708 are etched back in preparation for depositing the interpoly dielectric (IPD). The result of step 526 is depicted in FIG. 6F.

In step 527, the SiN layer 610 is stripped. The result of this step for option A is depicted in FIG. 6G. The dielectric cap 408 will have a relatively flat top if the nitride hard mask 610 is removed after the etch back.

In option B, the nitride mask 610 is removed (step 527) prior to the etch back of the STI material 407 and oxide spacer 708 (step 526). The result of performing option B is depicted in FIG. 6H. The dielectric cap 408 will have a relatively rounded top if the nitride hard mask 610 is removed prior to the etch back. When using option B, the etch may have a small horizontal component and slightly etch both the oxide cap 408 and the polysilicon that forms the floating gate stem 412a. Hence, earlier in the process the floating gate stem 412a should be defined to be wider than the final desired target width.

In step 528, the inter-poly dielectric (e.g. dielectric 406) is grown or deposited. The IPD may include alternating conformal layers of oxide and nitride. For example, an Oxide Nitride Oxide (ONO) inter-poly dielectric is used. In one embodiment, the IPD comprises nitride-oxide-nitride-oxide-nitride. The result of step 528 is depicted in FIG. 6I. Note that the dielectric cap 408 is depicted in FIG. 6I as having curvature, although the curvature is not required.

In step 530, the control gates (word lines) are deposited. Step 530 may include depositing a poly-silicon layer, a Tungsten Silicide (WSi) layer and a Silicon Nitride (SiN) layer. When forming the control gates photolithography is used to create patterns of strips perpendicular to the NAND chain, in order form word lines that are isolated from one another. In step 530, etching is performed using plasma etching, ion milling, ion etching that is purely physical etching, or another suitable process to etch the various layers and form the individual word lines.

In step 532, an implant process is performed to create the N+ source/drain regions 444. Arsenic or phosphorous implantation can be used. In one embodiment, a halo implant is also used. In some embodiments, an anneal process such as a rapid thermal anneal (RTA) is performed. Example parameters for RTA are heating to 1000 Celsius for ten seconds.

FIG. 4A depicts a cross section of the memory array along cut A-A of FIG. 3 after step 532 when option B is used to cause rounding at the top of the dielectric cap 408. FIG. 4B depicts a cross section of the memory array along cut B-B of FIG. 3 after step 532 when option B is used.

There are many alternatives to the above described structures and processes within the spirit of the present invention. As in the existing NAND embodiments, an alternative is to fabricate the memory cells from PMOS devices with opposite polarity bias conditions for the various operations as compared to the existing NMOS implementation. In the above examples, the substrate is made of silicon. However, other materials known in the art can also be used such as Gallium Arsenide, etc FIG. 7 is a graph illustrating electric fields as a function of floating gate stem width for various configurations of non-volatile storage elements. Curve 702 represents the electric field in the IPD 406 just above the top of the floating gate without the use of a dielectric cap 408 for a floating gate similar to the one depicted in FIG. 1C. The electric field was determined based on a simulation and represents a point in the IPD above the tip of the arrow labeled "A" in FIG. 1C. Note that as the width of the floating gate stem is made more narrow the strength of the electric field becomes stronger. Moreover, the strength of the electric field increases dramatically when the stem width is reduced below 200 A.

Figure 1A:
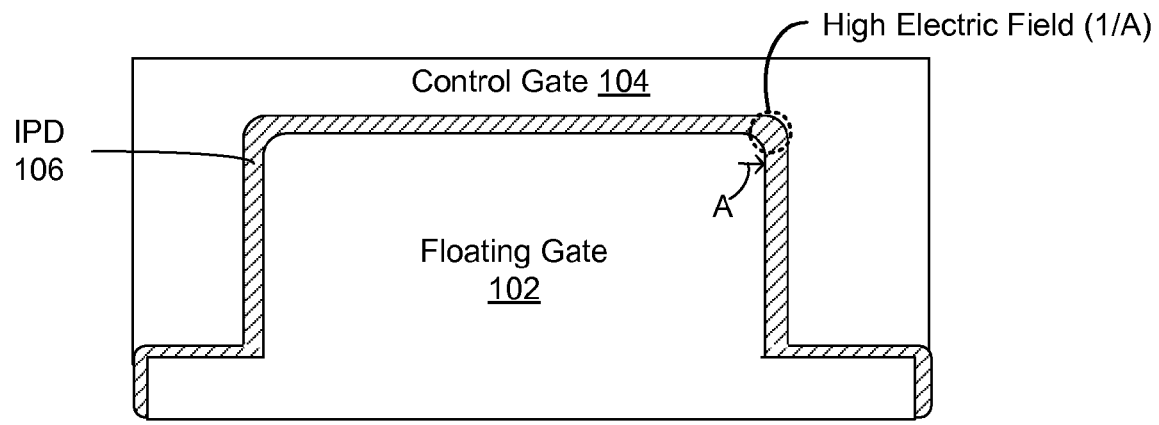
FIG. 1A, FIG. 1B, and FIG. 1C depict the structure of different floating gate/control gate interfaces.
Figure 1B:
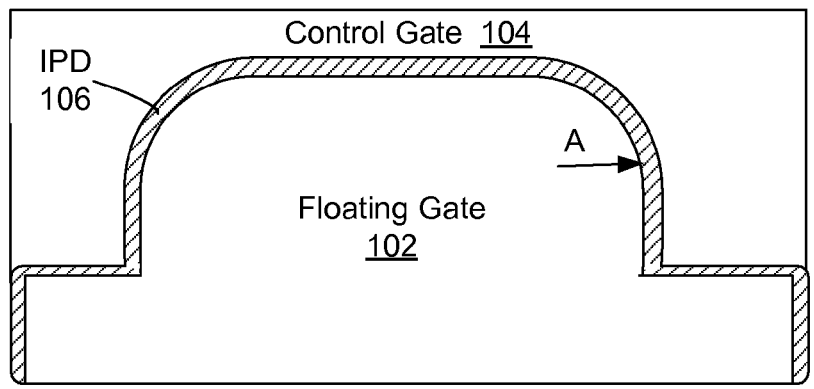
Figure 1C:
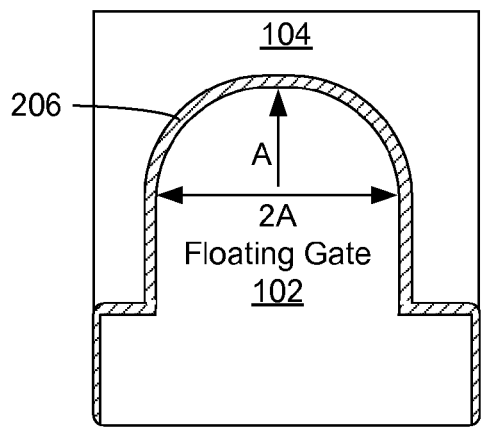

Curve 704 represents the electric field in the IPD at the top corner of the floating gate without the use of a dielectric cap 408 for a floating gate similar to the one depicted in FIG. 1C. The electric field was determined based on a simulation and represents a point in the IPD to either the left or the right of the double arrow labeled "2A" in FIG. 1C. Note that the strength of the electric field for a given floating gate stem width is greater at the tip of the stem (curve 702) than at the corner (curve 704).

Point 706 represents the electric field in the IPD 406 at the top corner of the stem 412a of the floating gate 412 (labeled as "corner field" in FIG. 4A) with the use of a hemispherical dielectric cap 408 similar to the non-volatile storage elements depicted in FIG. 4A. The floating gate 412 has a width of 100 A.

Point 708 represents the electric field in the IPD 406 at the top of stem 412a of the floating gate 412 (labeled as "top field" in FIG. 4A) with the use of a dielectric cap 408 similar to the non-volatile storage elements depicted in FIG. 4A. Note that the strength of the electric field at the tip of the floating gate (point 708) is less than the strength of the electric field at the corner of the floating gate (point 706). Moreover, because the strength of the electric field at the top of the stem 412a is reduced, the amount of leakage current in that region is reduced.

Reducing the strength of the electric field at the top of the floating gate may reduce overall leakage current substantially without significantly impacting overall performance. Note that while some dielectric material has been added in the IPD, the overall amount of dielectric is not increased much. Thus, the coupling between the floating gate and control gate is not severely impacted. Yet, the leakage current has been reduced in a region where it was the biggest problem.

Figure 8A:
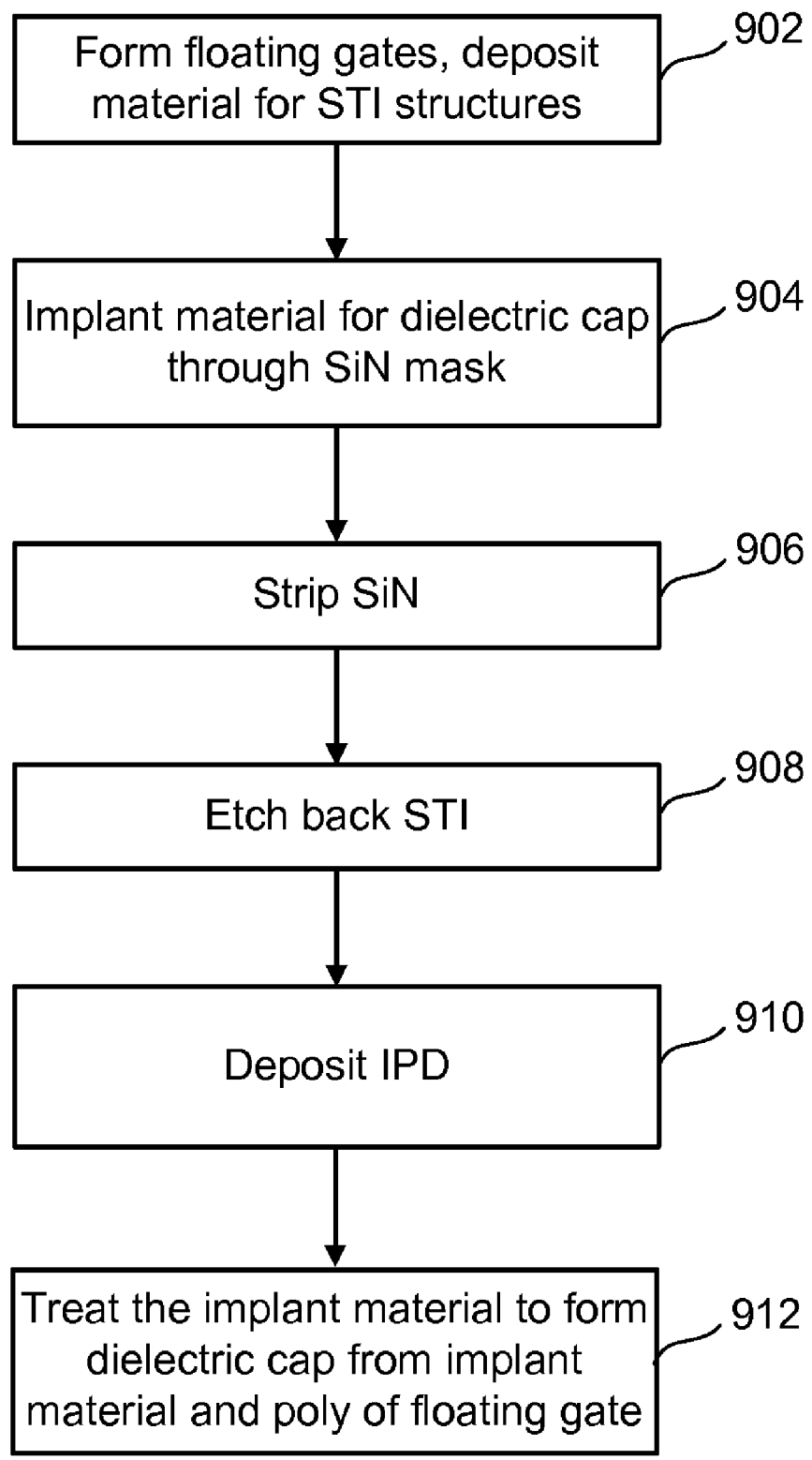
FIG. 8A is a flow chart describing one embodiment of a process for making a non-volatile memory cell array.

FIG. 8A a flow chart describing one embodiment of a portion of the process for manufacturing the memory cell of FIGS. 4A and 4B. FIGS. 9A-9E depict various stages of formation in accordance with the process of FIG. 8A. FIGS. 9A-9E depict a cross section along line A-A in FIG. 3. In this example, the floating gates are relatively narrow when viewed in a cross section taken along the word line. However, note that the principles discussed herein apply to floating gates that are narrow when viewed in a cross section taken along the bit line or both the word line and the bit line.

In the process of FIG. 8A, the dielectric cap 408 is formed by implanting a material such as oxygen at the top of the floating gate 412 and treating the floating gate 412 by a process such as annealing to cause the dielectric cap 408 to be formed by the implanted oxygen and polysilicon of the floating gate 412. It is not required that oxygen be the implanted material. In one implementation, nitrogen is implanted.

The flow chart of FIG. 8A does not depict initial steps used to form the floating gate 412. Furthermore, the flow chart does not depict most implant steps, the gap fill of etched volumes between the stacks, or forming the contacts, metallizations, vias, and passivation, as well as other portions of the manufacturing process known in the art. There are many ways to manufacture memory according to the present disclosure and, thus, the inventors contemplate that various methods other than that described by FIG. 8A can be used. While a flash memory chip will include core memory and peripheral circuitry, the process steps of FIG. 8A are intended only to describe in general terms one possible process recipe for the fabrication of the core memory array.

Figure 9A:
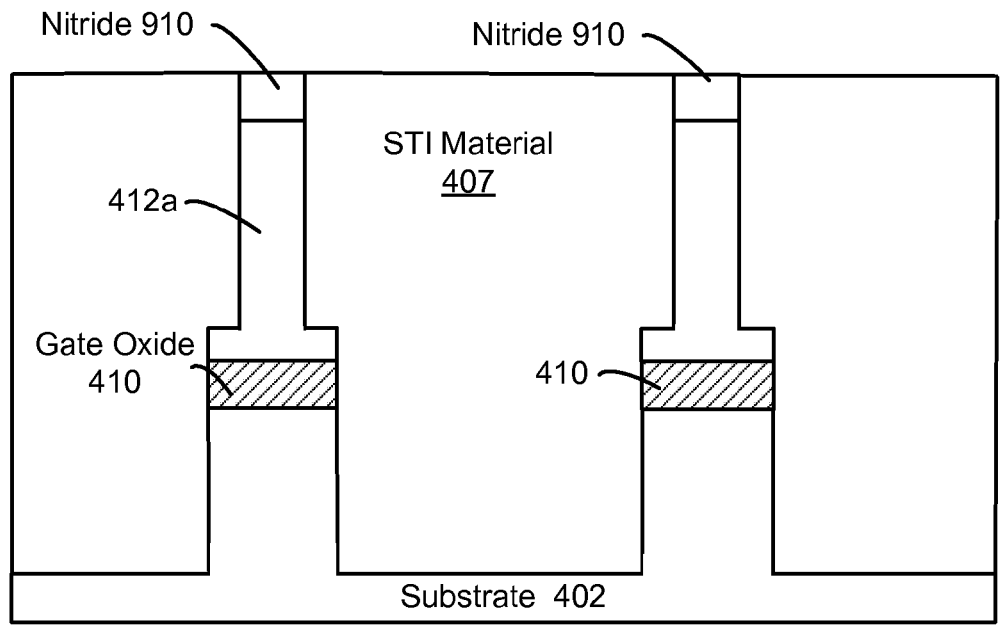
FIG. 9A, FIG. 9B, FIG. 9C, FIG. 9D, and FIG. 9E illustrate non-volatile storage elements in various stages of the fabrication process of FIG. 8A.

Step 902 is to form the floating gates and deposit material for STI structures. FIG. 9A shows two memory cells at a stage after STI material 407 has been deposited around the floating gates 412. Specifically, FIG. 9A depicts two floating gates 412 formed above a substrate 402. A gate oxide 410 has been formed between the floating gates 412 and the substrate 402. A nitride mask 910 is still in place above the floating gate stem 412a. A trench for STI material 407 has been etched into the substrate 402 with the STI material 407 filling the trench and also extending to the top of the nitride mask 610. Techniques for forming the memory cells up to the point depicted in FIG. 9A are well-known and hence will not be discussed in detail.

Figure 9B:
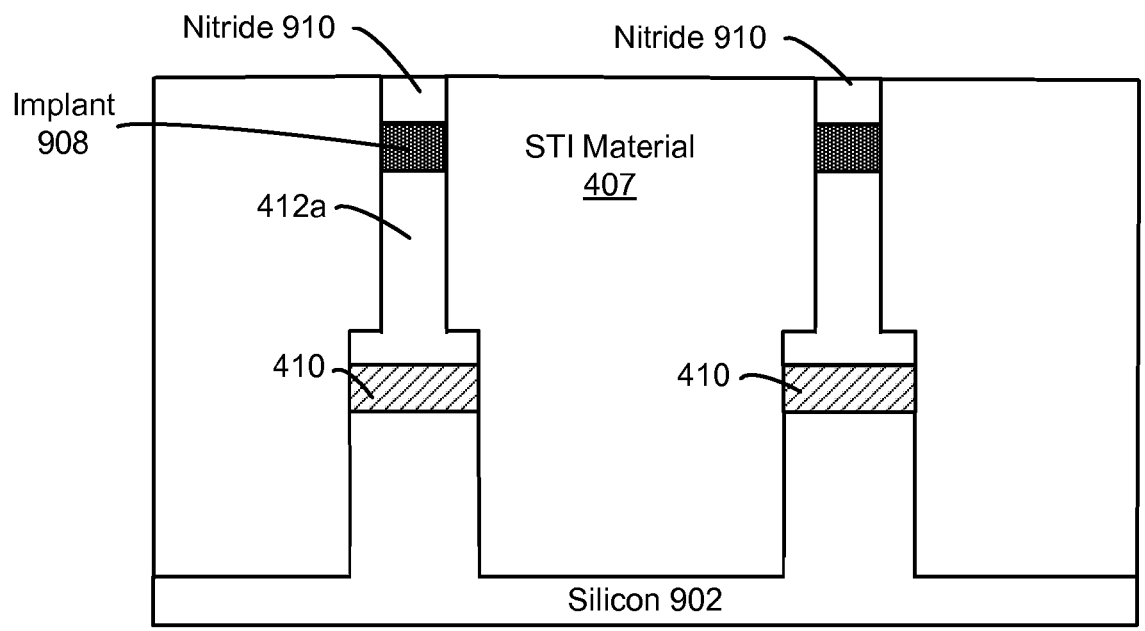

Step 904 is the step of implanting a material into the top surface of the floating gate 412 to serve as seed material to later form the dielectric cap 408. In this embodiment, the material is implanted through the nitride mask 910. FIG. 9B depicts the memory cells after the seed material 908 has been implanted into the top of the floating gate stem 412a with the nitride mask 910 still in place. Later in the process, the seed material 908 will be treated (e.g., by heat) to form the dielectric cap 408. In one embodiment, the seed material 908 is oxygen. The oxygen may be implanted with a technique that is similar to separation by implanted oxygen (SIMOX). SIMOX is a technique for fabricating silicon-on-insulator structures and substrates by implanting high doses of oxygen, followed by high temperature annealing. For example, the SIMOX process implants oxygen ions into a silicon substrate at a desired depth by selection of the energy at which the ions are implanted. After ion implantation, annealing is performed to convert the oxygen ions, along with silicon in the substrate, to silicon dioxide. Using SIMOX, carefully controlled layers of silicon dioxide have been formed buried into silicon substrates. However, whereas SIMOX typically is used to form a buried layer of silicon dioxide at a certain depth in a substrate, the present technique forms the dielectric cap 408 at the top of a floating gate 412.

Note that the seed material 908 can be implanted through the SiN 910 by appropriate control of the implantation process. The depth and concentration can be controlled by the energy and dose of oxygen. The energy at which the ions are implanted controls the depth. The concentration of the seed material 908 may be non-uniform in the vertical direction. For example, the distribution may be approximately Gaussian. By appropriate selection of the energy used to implant the material, the peak of the Gaussian distribution can be established very near the surface of the floating gate stem 412*a*.

One or more later process steps such as annealing that follows implanting ions in the substrate 402 to form source/drain regions has the side effect of converting the oxygen to silicon dioxide. Note that it is not necessary to add a step to convert the seed material 908, although an additional step could be performed if desired.

It is not required that the seed material 908 be oxygen. In another embodiment, the seed material 908 is nitrogen. In that case, the dielectric cap 408 will be SiN. In one embodiment the seed material 908 includes both oxygen and nitrogen. Still other seed materials can be used.

In one implementation, in addition to the seed material 908, a control material is implanted to control how the dielectric cap 408 forms. The control material may control the rate at which the dielectric cap 408 forms during annealing. For example, argon can be implanted along with oxygen to control the rate at which the silicon dioxide is formed from the seed material 908. The argon may increase the rate at which silicon dioxide is formed. In one implementation, the argon is driven off during steps such as annealing such that little or no argon remains. However, in some implementations, some argon may remain after the memory cells are formed.

Figure 9C:
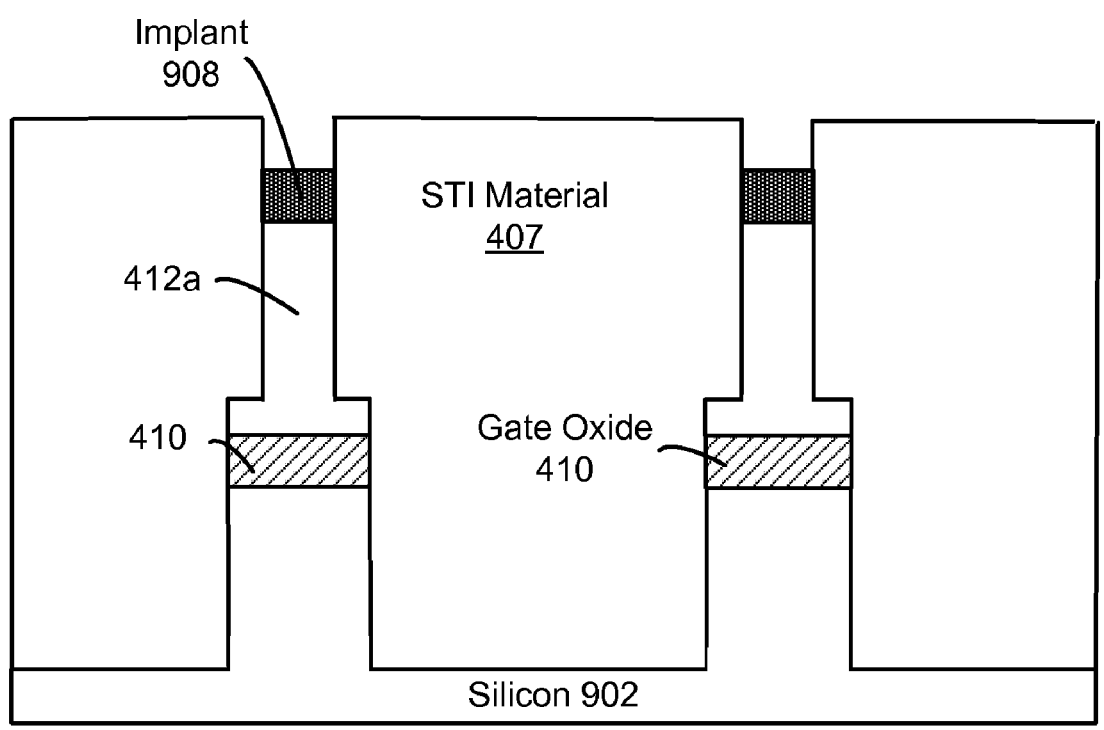
Figure 9D:
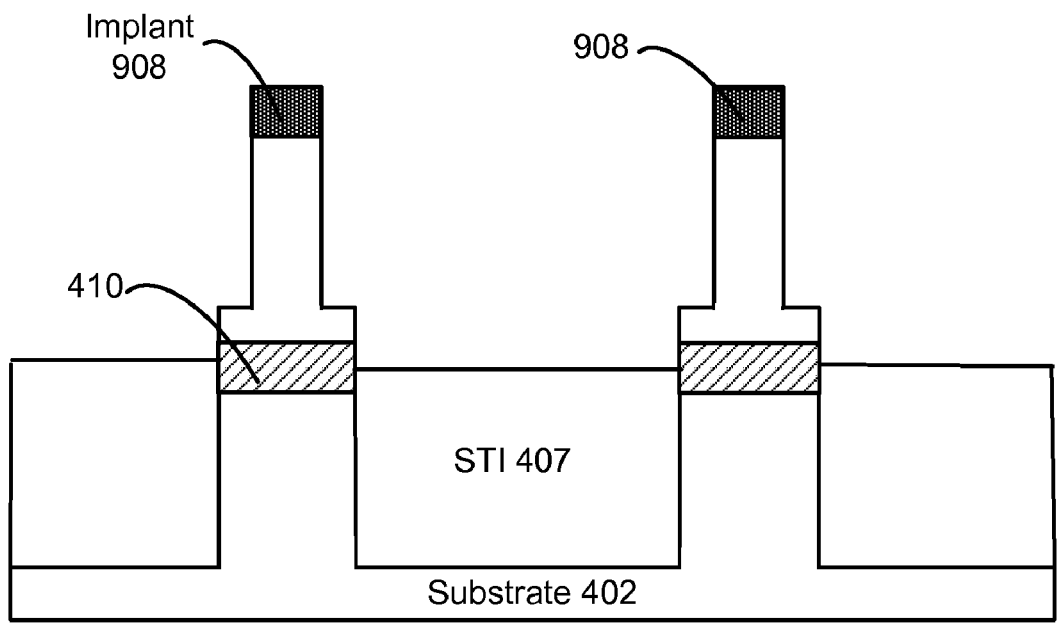

In step 906, the SiN mask 910 is stripped. The result is depicted in FIG. 9C. In step 908, the STI material 407 is etched back. The result is depicted in FIG. 9D showing that the STI material 407 has been etched back to the level of the gate dielectric 410.

Figure 9E:
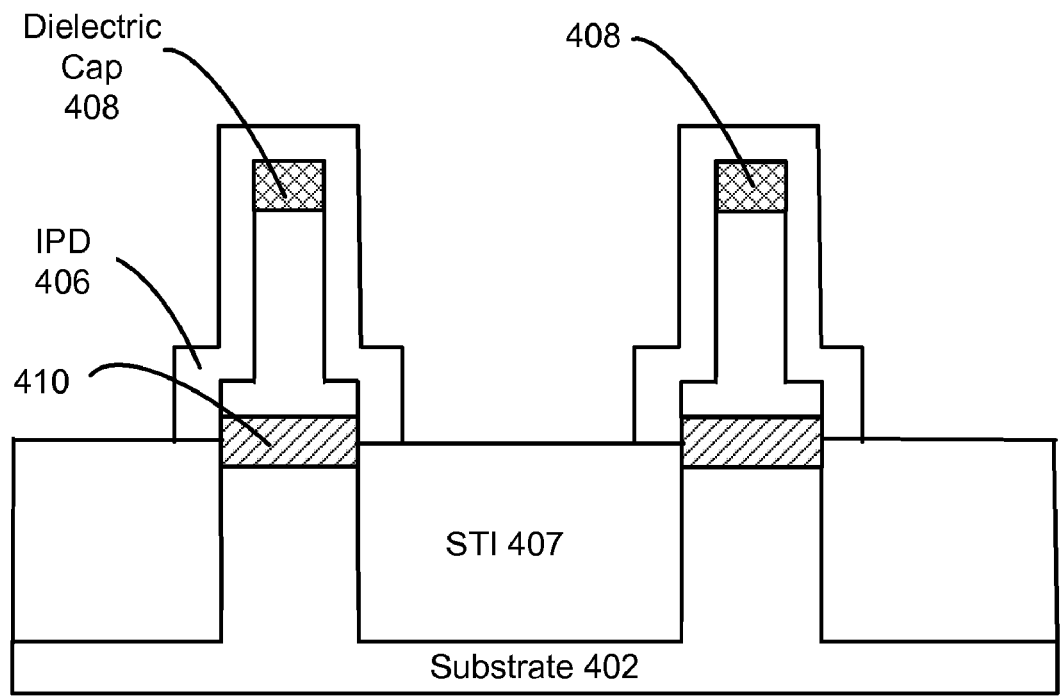

In step 910, the inter-poly dielectric (e.g. dielectric 406) is grown or deposited. For example, an Oxide Nitride Oxide (ONO) inter-poly dielectric is used. Depositing the IPD may serve to heat the material in the floating gate 412 to a sufficiently high temperature to at least partially form the dielectric cap 408. For example, silicon dioxide may begin to form from implanted oxygen and the silicon from which the floating gate 412 was formed. Note that some implanted oxygen may remain in the floating gate 412 after forming the IPD 406. Later thermal process steps may convert this oxygen to silicon dioxide. FIG. 9E shows the result after step 910. After step 410, well-known steps can be used to form control gates, source/drain regions, and other aspects of the memory cell.

In step 912, the seed material 908 is treated to form the dielectric cap 408 from the seed material 908 and the polysilicon at the top of the floating gate stem 412*a*. In an embodiment in which the seed material is oxygen, the treating of the seed material 908 is achieved by a process step that heats the seed material 908 to a sufficiently high temperature to form SiO$_2$ from the implanted oxygen and the polysilicon of the floating gate 412. Note that one or more process steps can achieve this desired affect. As previously discussed, forming the IPD 406 may at least in part achieve the treating of the seed material 908.

Annealing that is performed when forming source/drain regions is one example of a process step that treats the seed material 908. Thus, a process step that will be performed for another purpose also serves to treat the seed material to form the dielectric cap 408. Typically, source/drain regions are formed by implanting into the substrate a material such as arsenic or phosphorous. After implantation, an anneal process (e.g., rapid thermal anneal (RTA)) is performed. Example parameters for RTA are heating to 1000 Celsius for ten seconds. Such a RTA may serve to convert the majority of the seed material (e.g., oxygen) to SiO$_2$. However, some seed material 908 may be left over. This left over seed material 908 may be treated by a different process step. For example, a sidewall oxidation process step may treat the seed material 908 to at least partially form the dielectric cap 408. For sidewall oxidation, the device is placed in a furnace at a high temperature and with some fractional percentage of ambient oxygen gas, so that the exposed surfaces oxidize, which provides a protection layer. Sidewall oxidation can also be used to round the edges of the floating gate and the control gate. Note that sidewall oxidation may be performed prior to forming source/drain regions.

Figure 8B:
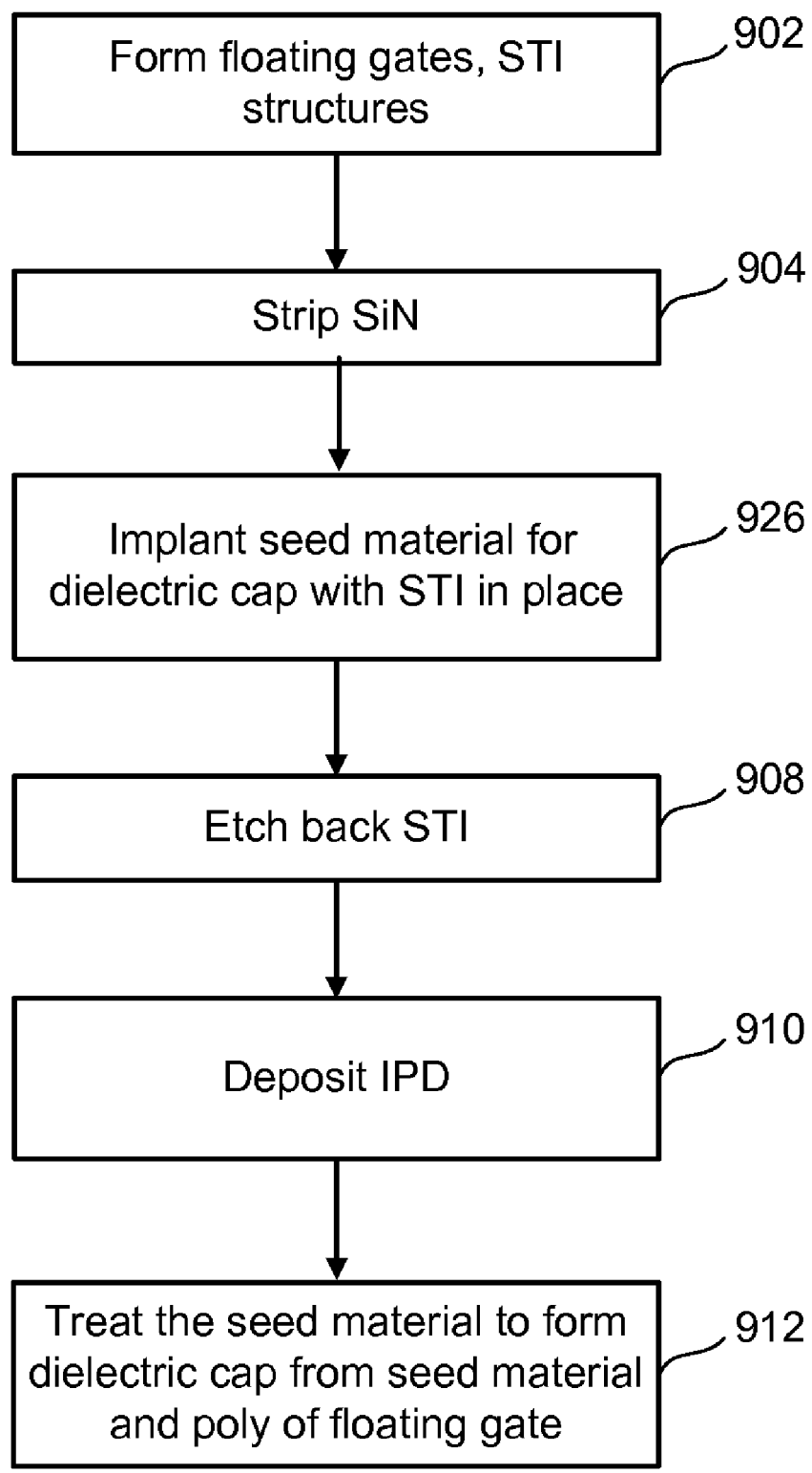
FIG. 8B is a flow chart describing one embodiment of a process for making a non-volatile memory cell array.
Figure 9F:
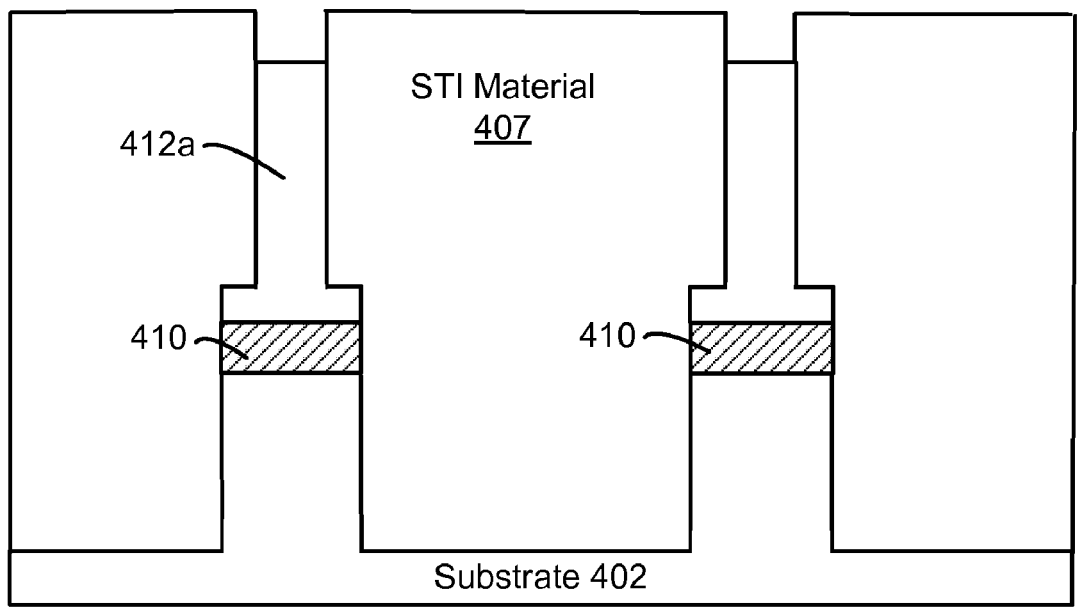
FIG. 9F and FIG. 9G illustrate non-volatile storage elements in a stage of the fabrication process of FIG. 8B.
Figure 9G:
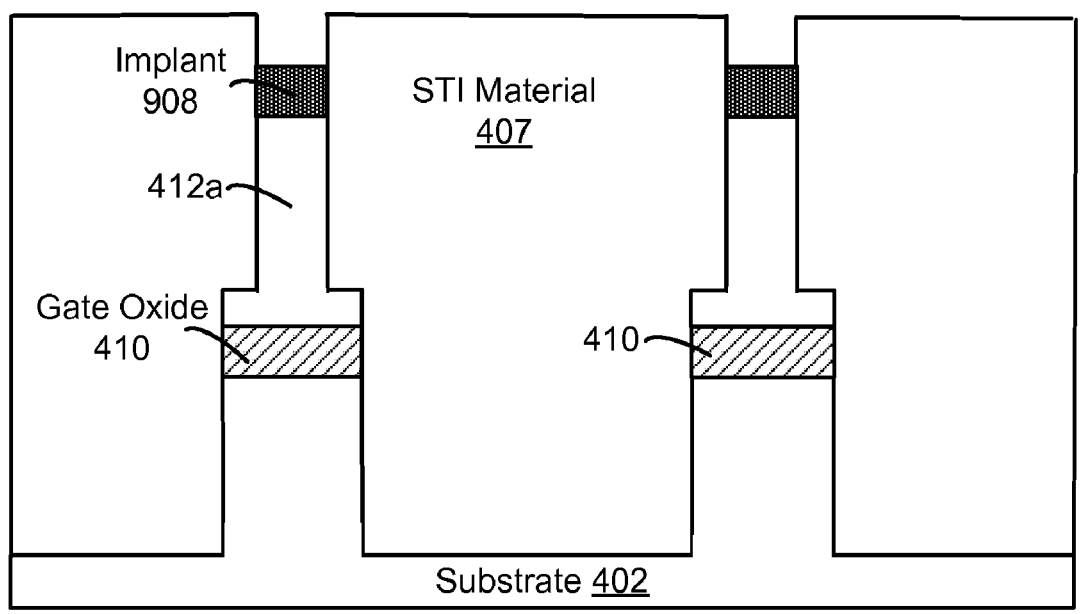

FIG. 8B a flow chart describing one embodiment of a portion of the process for manufacturing the memory cell of FIGS. 4A and 4B. The process of FIG. 8B is an alternative to the process of FIG. 8A. FIGS. 9F-9G, which are a cross section along line A-A in FIG. 3, depict stages of formation in accordance with initial steps described in process of FIG. 8B. FIGS. 9D-9E (already described in the discussion of the process of FIG. 8A) depict later stages of formation. In this example, the floating gates are relatively narrow when viewed in a cross section taken along the word line. However, note that the principles discussed herein apply to floating gates that are narrow when viewed in a cross section taken along the bit line or both the word line and the bit line.

The process of FIG. 8B starts with the formation of the floating gates and STI material 407 in step 902, which has been already discussed with respect to FIG. 8A. Then, the SiN mask 910 is stripped away in step 904. FIG. 9F depicts memory cell formation after step 904 of the process of FIG. 8B.

In step 926, the seed material 908 for the dielectric cap 408 is implanted into the top of the floating gate stem 412*a*. FIG. 9G depicts the result after step 926. Step 926 may be similar to implantation step 904 of FIG. 8A. However, because the seed material 908 is implanted directly into the polysilicon of the floating gate 412 instead of through the SiN mask 910, a lower implantation energy may be used in step 926. In one embodiment, the seed material is oxygen. In another embodiment, the seed material is nitrogen. In one embodiment, a control material such as argon is also implanted.

Step 908 is etching back the STI material 407, the result has already been depicted in FIG. 9D. Step 910 is depositing the IPD material 406, the result has already been depicted in FIG. 9E. In step 912, the seed material 908 is treated to form the dielectric cap 408 from the seed material 908 and the polysilicon at the top of the floating gate stem 412*a*. Step 912 has already been discussed with respect to FIG. 8A.

Figure 8C:
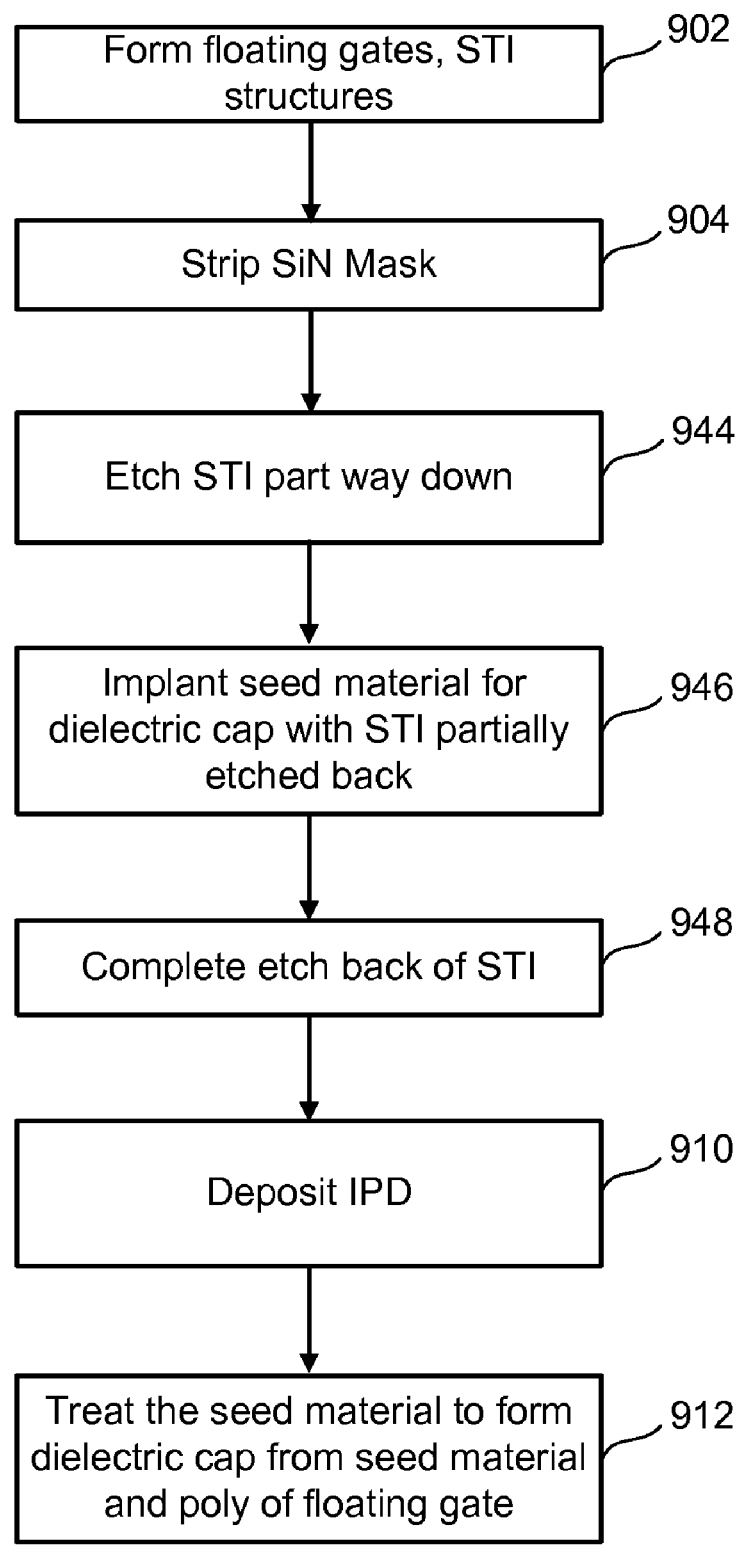
FIG. 8C is a flow chart describing one embodiment of a process for making a non-volatile memory cell array.
Figure 9H:
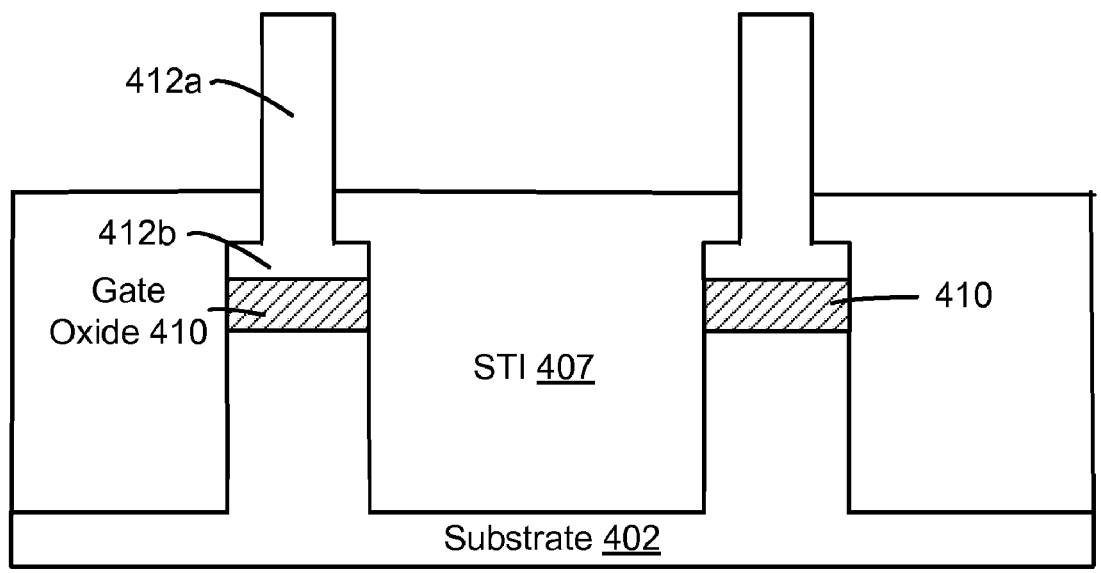
FIG. 9H and FIG. 9I illustrate non-volatile storage elements in various stages of the fabrication process of FIG. 8C.
Figure 9I:
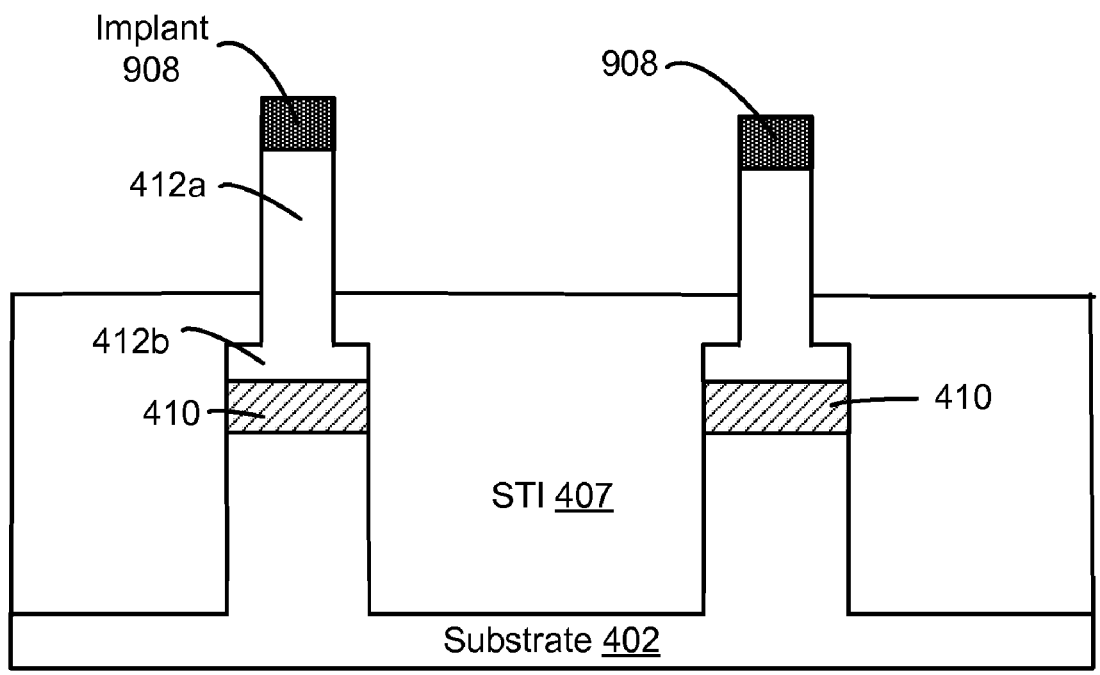

FIG. 8C a flow chart describing one embodiment of a portion of the process for manufacturing the memory cell of FIGS. 4A and 4B. The process of FIG. 8C is an alternative to the processes of FIG. 8A and 8B. FIGS. 9H-9I, which are a cross section along line A-A in FIG. 3, depict stages of formation in accordance with initial steps described in process of FIG. 8C. FIGS. 9D-9E (already described in the discussion of the process of FIG. 8A) depict later stages of formation. In this example, the floating gates are relatively narrow when viewed in a cross section taken along the word line. However, note that the principles discussed herein apply to floating gates that are narrow when viewed in a cross section taken along the bit line or both the word line and the bit line.

The process of FIG. 8C starts with the formation of the floating gates 412 and STI material 407 in step 902, which has been already discussed with respect to FIG. 8A. In step 904, the SiN mask 910 is stripped.

Next, the STI material 407 is etched back part way in step 944. The result of step 944 is depicted in FIG. 9H, which shows that a STI material 407 has been etched down to expose a portion of the floating gate stem 412a. However, the lower portion of the floating gate stem 412a and the floating gate base 412b are still covered by the STI material 407. The exact depth to which the STI material 407 is etched back to is not critical. In one implementation, the etch is stopped at a point before the floating gate base 412b is reached such that when the seed material is added it does not reach the floating gate base 412b. Note that in this embodiment, the energy at which the oxygen is implanted may be kept relatively low because the top of the floating gate stem 412a is exposed and the oxygen is only implanted to a very shallow depth.

In step 946, the seed material 908 is implanted into the top of the floating gate stem 412a, with the STI material 407 etched back to expose the sides of the floating gate stem 412a at the top. In one embodiment, the material is oxygen. In another embodiment, the material is nitrogen. In one embodiment, a control material such as argon is also implanted. FIG. 9I depicts the results after step 946. Note that in this implementation, the majority of the STI etch back is performed prior to the implant step.

In step 948, the STI material 407 is etched back further. Note that any seed material that may have been implanted into the upper portion of the STI material 407 will be removed when the STI material 407 is etched back further in step 948. FIG. 9D depicts the result after step 948. In step 910, the IPD layer 406 is deposited. FIG. 9E depicts the result after depositing the IPD layer 406.

In step 912, the seed material 908 is treated to form the dielectric cap 408 from the seed material 908 and the polysilicon at the top of the floating gate stem 412a. Step 912 has already been discussed with respect to FIG. 8A.

Figure 10:
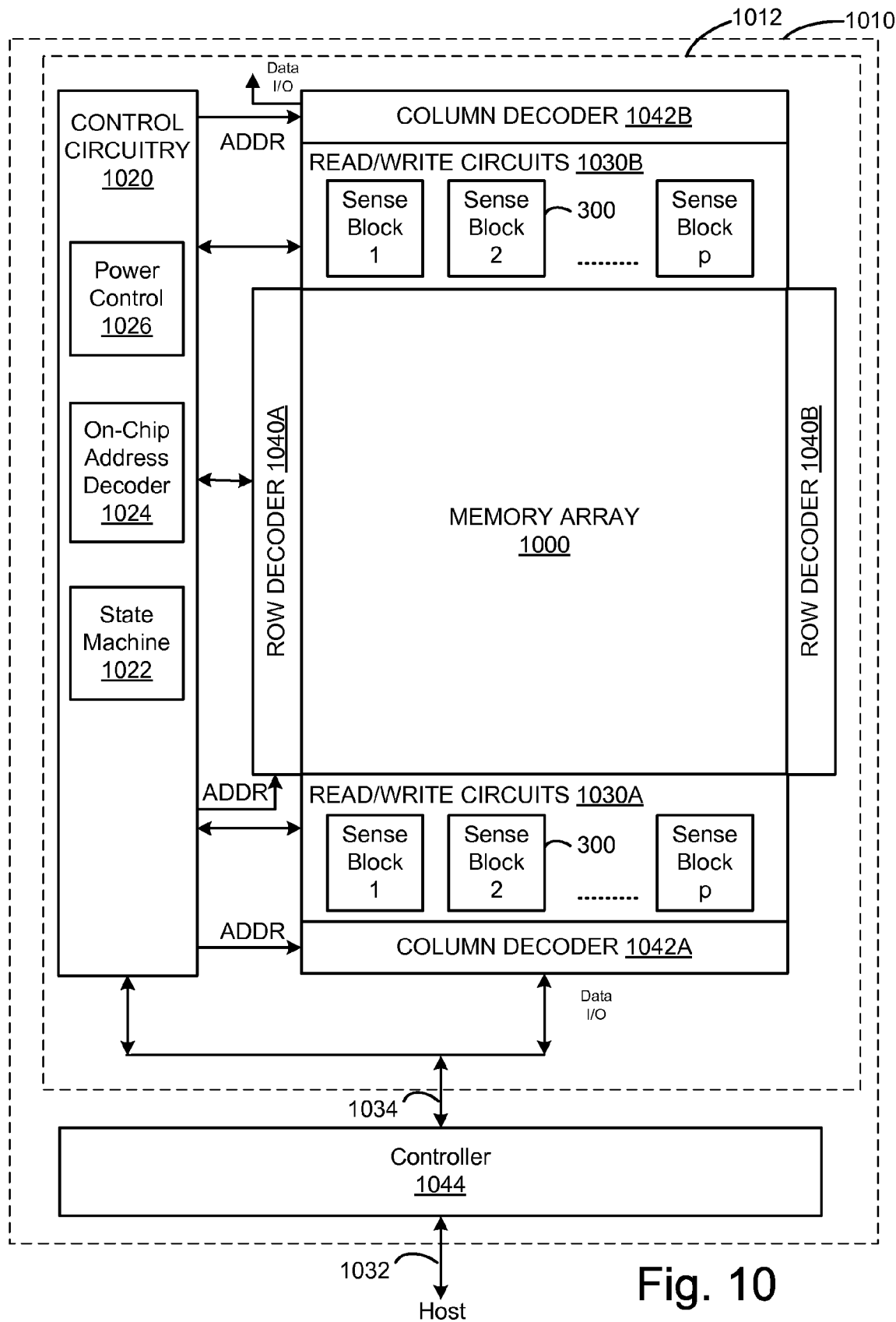
FIG. 10 is a block diagram of a non-volatile memory system.

FIG. 10 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 300 which allow a page of memory cells to be read or programmed in parallel. The memory array 100 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 11:
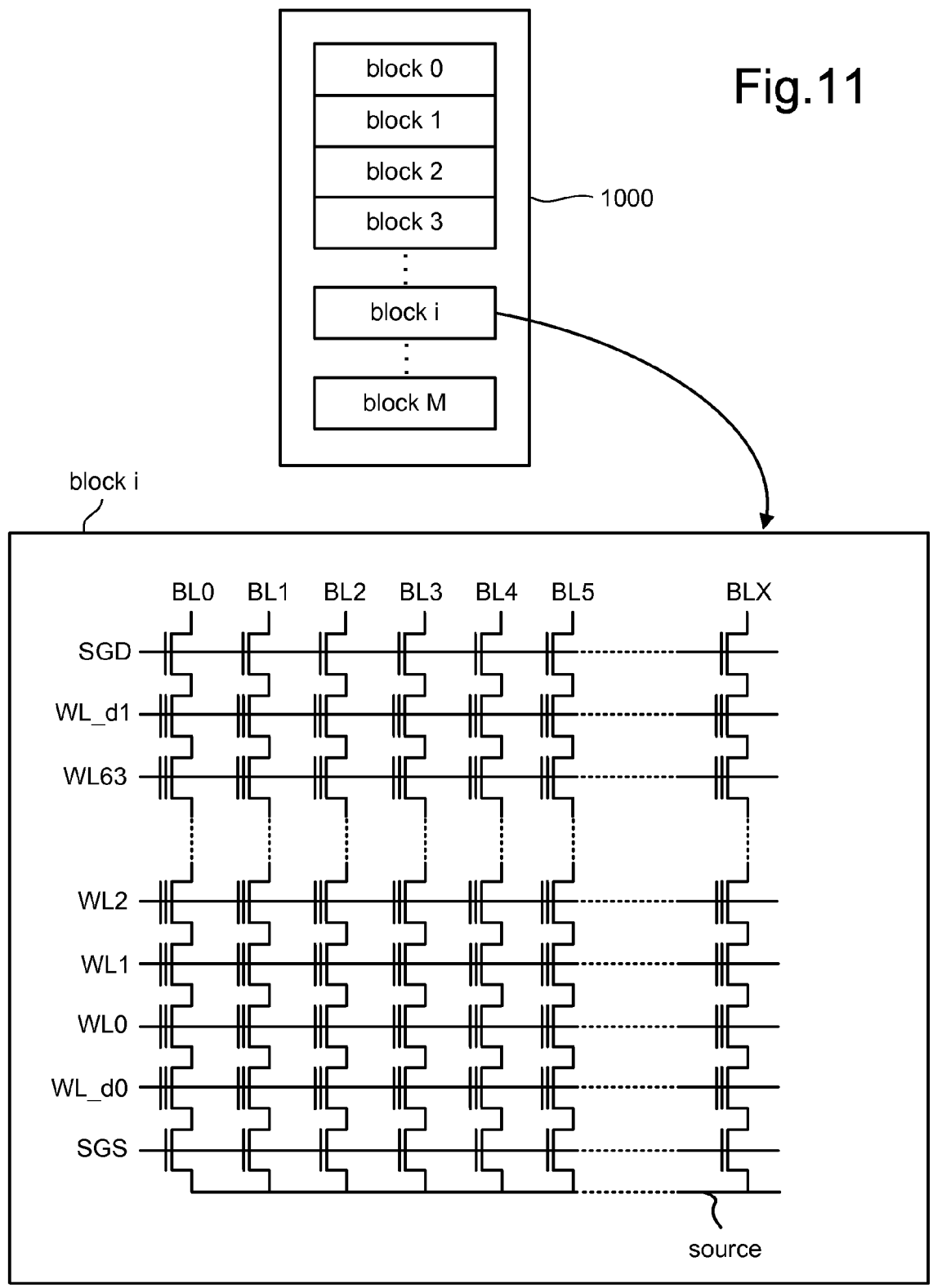
FIG. 11 is a block diagram depicting one embodiment of a memory array.

FIG. 11 depicts an exemplary structure of memory cell array 1000. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 11 shows more details of block i of memory array 1000. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data. Some embodiments do not include dummy memory cells.

Figure 12:
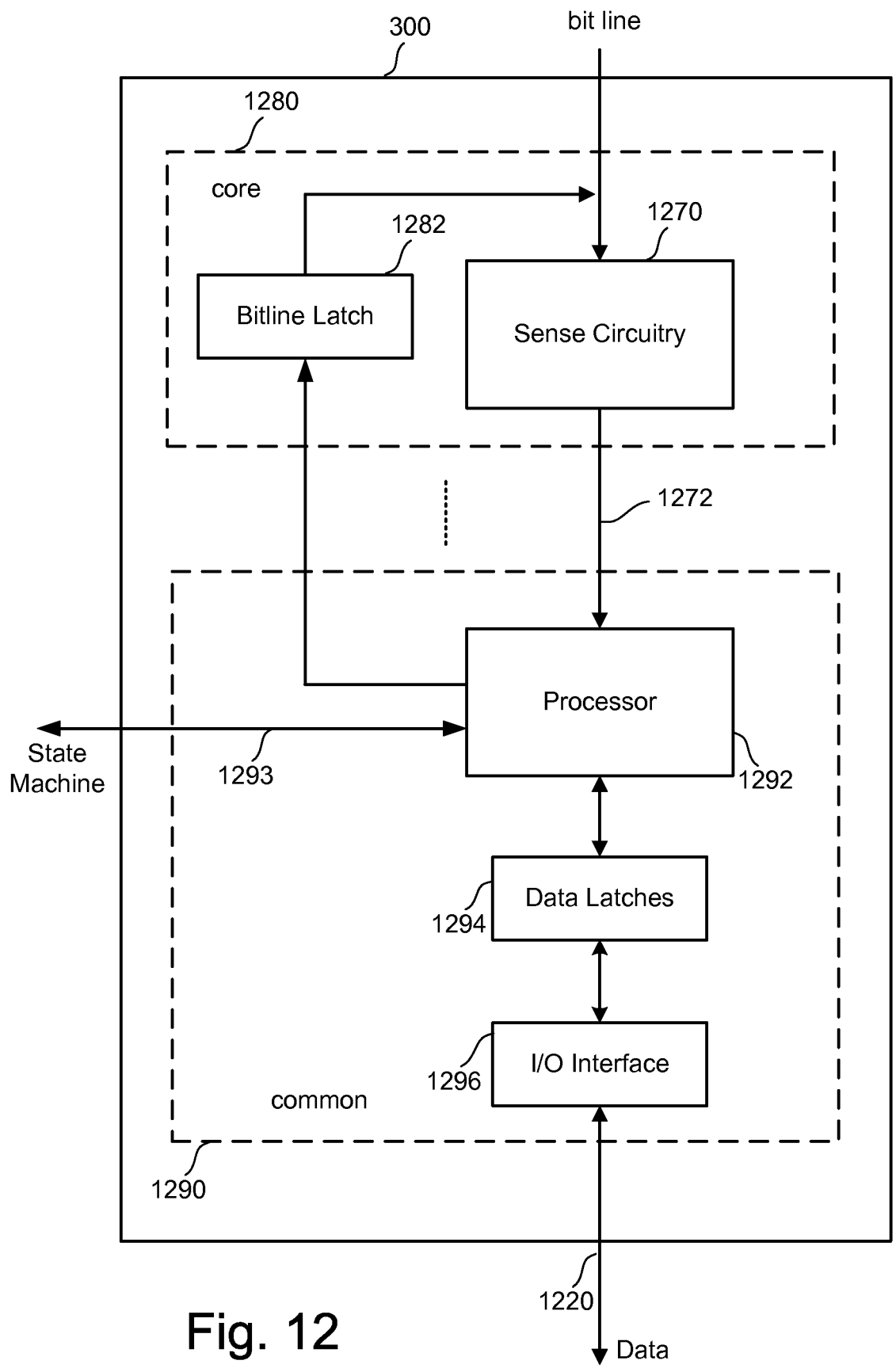
FIG. 12 is a block diagram depicting one embodiment of a sense block.

FIG. 12 is a block diagram of an individual sense block 300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) U.S. Patent Application Pub. No. 2006/0158947, "Reference Sense Amplifier For Non-Volatile Memory," published on Jul. 20, 2006. All five of the immediately above-listed patent documents are incorporated herein by reference in their entirety.

The foregoing detailed description of embodiments of the invention has been presented for purposes of illustration and description. It is not intended to be exhaustive or to limit the invention to the precise form disclosed. Many modifications and variations are possible in light of the above teaching. The described embodiments were chosen in order to best explain the principles of embodiments of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for forming non-volatile storage, the method comprising:
   forming a floating gate having a top and at least two sides;
   forming a dielectric cap on top of the floating gate, wherein the forming of the dielectric cap on the top of the floating gate includes implanting a first material and a second material into the top of the floating gate, the second material controlling the forming of the dielectric cap;
   forming an inter-gate dielectric layer around the at least two sides of the floating gate and covering the top of the dielectric cap; and
   forming a control gate covering the top of the floating gate, the inter-gate dielectric layer separates the control gate from the floating gate.

2. A method as recited in claim 1, wherein the forming a floating gate includes forming the floating gate from silicon; and wherein the forming a dielectric cap includes:
   implanting oxygen and argon in the top of the floating gate; and
   heating the floating gate to form the dielectric cap from the implanted oxygen and the silicon from which the floating gate was formed.

3. A method as recited in claim 2, wherein:
   the forming a floating gate includes using a hard mask; and
   the implanting oxygen in the top of the floating gate includes implanting oxygen through the hard mask.

4. A method as recited in claim 2, further comprising:
   depositing isolation material for a shallow trench isolation structure, the isolation material surrounding the at least two sides of the floating gate;
   planarizing the isolation material to a level of a hard mask that resides above the floating gate;
   removing a hard mask from above the floating gate;
   wherein the implanting oxygen in the top of the floating gate is performed after removing the hard mask but prior to removing the isolation material from the at least two sides of the floating gate.

5. A method as recited in claim 2, further comprising:
   depositing isolation material for a shallow trench isolation structure, the isolation material surrounding the sides of the floating gate;
   planarizing the isolation material to a level of a hard mask that resides above the floating gate;
   removing a hard mask from above the floating gate;
   etching back a portion of the isolation material to expose at least a portion of the at least two sides of the floating gate;
   wherein the implanting oxygen in the top of the floating gate is performed after the etching back a portion of the isolation material.

6. A method as recited in claim 1, wherein the forming a floating gate and the forming a dielectric cap include:
   forming a layer of polysilicon to be used to form the floating gate;
   forming an oxide layer above the polysilicon, the oxide layer to be used for the dielectric cap;
   forming a pattern above the oxide layer;
   etching the oxide layer and the polysilicon based on the pattern to form the dielectric cap and the floating gate.

7. A method as recited in claim 6, wherein the forming the floating gate and the forming the dielectric cap further include:
   selectively oxidizing the polysilicon that is used to form the floating gate to provide curvature to the top of the floating gate, the oxidized portion of the polysilicon forms a part of the dielectric cap.

8. The method of claim 1, wherein the forming a control gate further includes forming the control gate around the at least two side surfaces of the floating gate.

9. The method of claim 1, wherein the forming an inter-gate dielectric layer around the at least two sides of the floating gate and over the dielectric cap includes:
   forming alternating conformal layers of oxide and nitride.

10. A method for forming non-volatile storage, the method comprising:
    forming a floating gate having a top surface and at least two side surfaces, the floating gate comprises polysilicon;
    implanting a seed material and a second material into the top surface of the floating gate;
    forming an inter-gate dielectric layer around the at least two side surfaces of the floating gate and covering the top surface of the floating gate;
    forming a control gate covering the inter-gate dielectric; and
    performing at least one thermal process step to form a dielectric cap on the top of the floating gate from the implanted seed material and the polysilicon used to form the floating gate;
    wherein the second material controls the forming of the dielectric cap.

11. The method of claim 10, wherein the implanting a material into the top surface of the floating gate includes:
    implanting oxygen into the top surface of the floating gate.

12. The method of claim 10, wherein the implanting a material into the top surface of the floating gate includes:
    implanting oxygen and nitrogen into the top surface of the floating gate.

13. The method of claim 10, wherein the implanting a material into the top surface of the floating gate includes:
    implanting nitrogen into the top surface of the floating gate.

14. The method of claim 10, wherein the forming an inter-gate dielectric layer around the at least two side surfaces of the floating gate and over the top surface of the floating gate includes:
    forming alternating conformal layers of oxide and nitride.

15. The method of claim 10, further comprising:
    implanting ions into a substrate; and
    performing a rapid thermal anneal to form a source/drain region where the ions were implanted in the substrate, the rapid thermal anneal serves as at least one thermal process step to form the dielectric region.

16. A method for forming non-volatile storage, the method comprising:
    forming a plurality of floating gates from polysilicon, individual ones of the floating gate have a stem and a base, individual ones of the stems include a top;
    implanting a seed material and a second material into the tops of the stems of the floating gates;
    forming alternating conformal layers of oxide and nitride around the stems of the floating gates and covering the bases of the floating gates, the conformal layers of oxide and nitride serve as an inter-gate dielectric;
    forming control gates around the stems and covering the bases of the floating gates, the inter-gate dielectric layer separates the control gates from the floating gates; and
    performing at least one thermal process step to form dielectric regions at the tops of the stems of the floating gates from the polysilicon from which the floating gates were formed and from the implanted material;
    wherein the second material controls the at least one thermal process step to form the dielectric regions.

17. The method of claim 16, wherein the implanting a material into the tops of the stems of the floating gates includes:
   implanting oxygen into the tops of the stems of the floating gates.

18. The method of claim 16, wherein the implanting a material into the tops of the stems of the floating gates includes:
   implanting oxygen and nitrogen into the tops of the stems of the floating gates.

19. The method of claim 16, wherein the implanting a material into the tops of the stems of the floating gates includes:
   implanting nitrogen into the tops of the stems of the floating gates.

20. The method of claim 16, further comprising:
   implanting ions into a substrate; and
   performing a rapid thermal anneal to form source/drain regions where the ions were implanted in the substrate, the source/drain regions electrically connect groups of the floating gates into NAND strings, the rapid thermal anneal serves as at least one thermal process step to form the dielectric regions.

* * * * *